(12) United States Patent
Prasad et al.

(10) Patent No.: US 11,222,920 B2
(45) Date of Patent: Jan. 11, 2022

(54) MAGNETIC DEVICE INCLUDING MULTIFERROIC REGIONS AND METHODS OF FORMING THE SAME

(71) Applicant: WESTERN DIGITAL TECHNOLOGIES, INC., San Jose, CA (US)

(72) Inventors: Bhagwati Prasad, San Jose, CA (US); Alan Kalitsov, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 51 days.

(21) Appl. No.: 16/781,225

(22) Filed: Feb. 4, 2020

(65) Prior Publication Data

US 2021/0242279 A1 Aug. 5, 2021

(51) Int. Cl.
| | | |
|---|---|---|
| *H01L 27/22* | (2006.01) | |
| *H01L 43/10* | (2006.01) | |
| *H01L 43/12* | (2006.01) | |
| *H01F 10/32* | (2006.01) | |
| *G06N 3/04* | (2006.01) | |
| *G11C 11/16* | (2006.01) | |

(52) U.S. Cl.
CPC ............ *H01L 27/228* (2013.01); *G06N 3/04* (2013.01); *H01F 10/3254* (2013.01); *H01F 10/3272* (2013.01); *H01L 43/10* (2013.01); *H01L 43/12* (2013.01); *G11C 11/161* (2013.01)

(58) Field of Classification Search
CPC ....... H01L 27/228; H01L 43/10; H01L 43/12; G06N 3/04; H01F 10/3254; H01F 10/3272; G11C 11/161

USPC .......................................................... 257/421
See application file for complete search history.

(56) References Cited

U.S. PATENT DOCUMENTS

| | | | |
|---|---|---|---|
| 5,198,994 A | 3/1993 | Natori | |
| 7,750,390 B2 * | 7/2010 | Saito | ................. H01L 29/66984 257/314 |

(Continued)

FOREIGN PATENT DOCUMENTS

| | | |
|---|---|---|
| EP | 0936622 B1 | 8/1999 |
| EP | 3128534 | 2/2017 |

(Continued)

OTHER PUBLICATIONS

Zheng et al., "Gate-controlled Non-Volatile Graphene-ferroelectric Memory," Appl. Phys. Lett. 94, 163505 (2009).

(Continued)

*Primary Examiner* — Jami Valentine Miller
(74) *Attorney, Agent, or Firm* — The Marbury Law Group PLLC

(57) ABSTRACT

A magnetic device includes a first electrode, a second electrode, a plurality of magnetic junctions each containing a ferromagnetic reference layer and a ferromagnetic free layer located between the first electrode and the second electrode, and a plurality of magnetoelectric multiferroic portions having different structural defect densities located between the first electrode and the second electrode. Each of the plurality of magnetoelectric multiferroic portions is magnetically coupled to the ferromagnetic free layer of a respective one of the plurality of magnetic junctions.

20 Claims, 13 Drawing Sheets

(56) References Cited

U.S. PATENT DOCUMENTS

| | | | |
|---|---|---|---|
| 9,646,666 B2* | 5/2017 | Datta | G11C 11/1673 |
| 9,721,963 B1 | 8/2017 | Rabkin et al. | |
| 9,817,088 B2* | 11/2017 | Naik | G01R 33/098 |
| 9,941,299 B1 | 4/2018 | Chen et al. | |
| 10,229,723 B1 | 3/2019 | Choi et al. | |
| 10,354,710 B2 | 7/2019 | Petti et al. | |
| 10,381,551 B1 | 8/2019 | Lille | |
| 10,403,753 B2 | 9/2019 | Jonker et al. | |
| 2001/0048622 A1 | 12/2001 | Kwon et al. | |
| 2003/0053350 A1 | 3/2003 | Krieger et al. | |
| 2003/0155602 A1 | 8/2003 | Krieger et al. | |
| 2003/0178667 A1 | 9/2003 | Krieger et al. | |
| 2003/0179633 A1 | 9/2003 | Krieger et al. | |
| 2004/0026729 A9 | 2/2004 | Krieger et al. | |
| 2004/0159835 A1 | 8/2004 | Krieger et al. | |
| 2005/0151177 A1 | 7/2005 | Miyazawa et al. | |
| 2007/0020803 A1 | 1/2007 | Saigoh et al. | |
| 2009/0026513 A1 | 1/2009 | Johansson et al. | |
| 2009/0073747 A1 | 3/2009 | Seigler | |
| 2010/0144064 A1 | 6/2010 | Saigoh et al. | |
| 2012/0069646 A1* | 3/2012 | Kramer | H01L 27/228 365/171 |
| 2012/0069647 A1* | 3/2012 | Kramer | H01L 43/08 365/171 |
| 2012/0069648 A1* | 3/2012 | Kramer | H01L 27/222 365/171 |
| 2012/0104325 A1 | 5/2012 | Talapin et al. | |
| 2014/0098458 A1 | 4/2014 | Almadhoun et al. | |
| 2015/0372225 A1 | 12/2015 | Gaidis et al. | |
| 2016/0141333 A1 | 5/2016 | Bandyopadhyay et al. | |
| 2016/0172365 A1 | 6/2016 | McKinnon et al. | |
| 2016/0276579 A1 | 9/2016 | Gaidis et al. | |
| 2016/0308107 A1 | 10/2016 | Talapin et al. | |
| 2017/0114241 A1 | 4/2017 | Almadhoun et al. | |
| 2017/0316713 A1 | 11/2017 | Hyman | |
| 2018/0158588 A1* | 6/2018 | Manipatruni | H01L 43/08 |
| 2018/0158934 A1 | 6/2018 | Jonker et al. | |
| 2018/0158955 A1 | 6/2018 | Jonker et al. | |
| 2018/0287052 A1* | 10/2018 | Wang | G11C 11/18 |
| 2019/0027201 A1 | 1/2019 | Petti et al. | |
| 2019/0080738 A1 | 3/2019 | Choi et al. | |
| 2019/0252015 A1* | 8/2019 | Sandhu | G11C 11/1675 |
| 2019/0386202 A1* | 12/2019 | Gosavi | G11C 11/18 |
| 2019/0386208 A1* | 12/2019 | Lin | H01L 43/10 |
| 2020/0006633 A1 | 1/2020 | Lille | |
| 2020/0211608 A1* | 7/2020 | Manipatruni | H01L 43/10 |

FOREIGN PATENT DOCUMENTS

| | | |
|---|---|---|
| JP | 2006210525 | 8/2006 |
| WO | WO2013090937 A1 | 6/2013 |

OTHER PUBLICATIONS

Song et al., "Robust bi-stable Memory Operation in Single-layer Graphene Ferroelectric Memory," Appl. Phys. Lett. 99, 042109 (2011).

Zheng et al., "Graphene Field Effect Transistors with Ferroelectric Gating," Phys. Rev. Lett. 105, 166602 (2010).

Cadore et al., "Thermo Activated Hysteresis on High Quality Graphene/h-BN Devices," Nano Lett. 14, 5437 (2014).

Ahn et al., "Energy-Efficient Phase-Change Memory with Graphene as a Thermal Barrier," Nano Letters, 15, 6809 (2015).

Huang et al., "Graphene/Si CMOS Hybrid Hall Integrated Circuits," Science Reports, 4, 5548 (2014).

Ismach et al., "Direct Chemical Vapor Deposition of Graphene on Dielectric Surfaces," Nano Letters, 10, 1542 (2010).

Miro et al., "An Atlas of Two-Dimensional Materials," Chem. Soc. Rev., 2014,43, 6537-6554.

Notification of Transmittal of the International Search Report and Written Opinion of the International Search Authority for International Patent Application No. PCT/US2019/046717, dated Nov. 17, 2019, 11 pages.

Saremi, S. et al., "Electronic Transport and Ferroelectric Switching in Ion-Bombarded, Defect-Engineered $BiFeO_3$ Thin Films," Adv. Mater. Interfaces 2018, vol. 5, 1700991, (2018).

Chiu, Y.C. et al., "Multilevel nonvolatile transistor memories using a star-shaped poly((4-diphenylamino)benzyl methacrylate) gate electret," NPG Asia Materials (2013), vol. 5, e35; doi:10.1038/am.2012. 64, available at https://www.nature.com/articles/am201264.

Jerry, M. et al., "Ferroelectric FET Analog Synapse for Acceleration of Deep Neural Network Training," Tech. Dig.—Int. Electron Devices Meeting (IEDM), IEEE, San Francisco, CA 2017, p. 6.2.1-6.2.4, IEDM17-139 (Published—Jan. 23, 2018).

Saremi, S. et al., "Local Control of Defects and Switching Properties in Ferroelectric Thin Films," Phys. Rev. Mater., vol. 2, 084414 (2018).

Heron, J. T. et al., "Electric field control of magnetism using BiFeO3-based heterostructures," Applied Physics Reviews, vol. 1, 021303 (2014); doi: 10.1063/1.4870957, View online: http://dx.doi.org/10.1063/1.4870957.

Manipatruni, S. et al., "Beyond CMOS computing with spin and polarization," Nature Physics, vol. 14, pp. 338-343, (2018), https://doi.org/10.1038/s41567-018-0101-4.

Spaldin, N. A. et al., "Advances in magnetoelectric multiferroics," Nature Materials, vol. 18, pp. 203-212, (2019), https://doi.org/10.1038/s41563-018-0275-2.

Sengupta, A. et al., "Encoding neural and synaptic functionalities in electron spin: A pathway to efficient neuromorphic computing," Applied Physics Reviews 4, 041105 (2017); https://doi.org/10.1063/1.5012763.

Lequex, S. et al., "A magnetic synapse: multilevel spin-torque memristor with perpendicular anisotropy" Scientific Reports, vol. 6, No. 31510 (2016), https://doi.org/10.1038/srep31510.

U.S. Appl. No. 16/212,132, filed Dec. 6, 2018, SanDisk Technologies LLC.

U.S. Appl. No. 16/212,257, filed Dec. 6, 2018, SanDisk Technologies LLC.

U.S. Appl. No. 16/212,342, filed Dec. 6, 2018, SanDisk Technologies LLC.

U.S. Appl. No. 16/212,420, filed Dec. 6, 2018, SanDisk Technologies LLC.

U.S. Appl. No. 16/227,889, filed Dec. 20, 2018, SanDisk Technologies LLC.

U.S. Appl. No. 16/250,403, filed Jan. 17, 2019, SanDisk Technologies LLC.

U.S. Appl. No. 16/401,172, filed May 2, 2019, SanDisk Technologies LLC.

U.S. Appl. No. 16/419,243, filed May 22, 2019, SanDisk Technologies LLC.

U.S. Appl. No. 16/422,187, filed May 24, 2019, SanDisk Technologies LLC.

U.S. Appl. No. 16/442,858, filed Jun. 17, 2019, SanDisk Technologies LLC.

U.S. Appl. No. 16/558,552, filed Sep. 3, 2019, SanDisk Technologies LLC.

U.S. Appl. No. 16/666,967, filed Oct. 29, 2019, SanDisk Technologies LLC.

U.S. Appl. No. 16/686,860, filed Nov. 18, 2019, SanDisk Technologies LLC.

U.S. Appl. No. 16/686,917, filed Nov. 18, 2019, SanDisk Technologies LLC.

U.S. Appl. No. 16/692,903, filed Nov. 22, 2019, SanDisk Technologies LLC.

U.S. Appl. No. 16/692,965, filed Nov. 22, 2019, SanDisk Technologies LLC.

U.S. Appl. No. 16/693,006, filed Nov. 22, 2019, SanDisk Technologies LLC.

U.S. Appl. No. 16/778,245, filed Jan. 31, 2020, SanDisk Technologies LLC.

Notification of Transmittal of the International Search Report and Written Opinion of the International Search Authority for International Patent Application No. PCT/US2020/035649, dated Sep. 24, 2020, 13 pages.

(56) References Cited

OTHER PUBLICATIONS

Srinivasan, G. et al., "Magnetic Tunnel Junction Based Long-Term Short-Term Stochastic Synapse for a Spiking Neural Network with On-Chip STDP Learning," Scientific reports 6 (2016): 29545, DOI: 10.1038/srep29545.
Xu, T. et al., "Defect-strain engineering for multiferroic and magnetoelectric properties in epitaxial (110) ferroelectric lead titanate," (Abstract) Phys. Rev. B 92, 104106—Published Sep. 14, 2015.
Morelli, A., et al., "Epitaxial Ferroelectric Nanostructures Fabricated by FIB Milling," (Abstract) In: Wang Z. (eds) FIB Nanostructures. Lecture Notes in Nanoscale Science and Technology, vol. 20. Springer, Cham, (2013), https://doi.org/10.1007/978-3-319-02874-3_2.

* cited by examiner

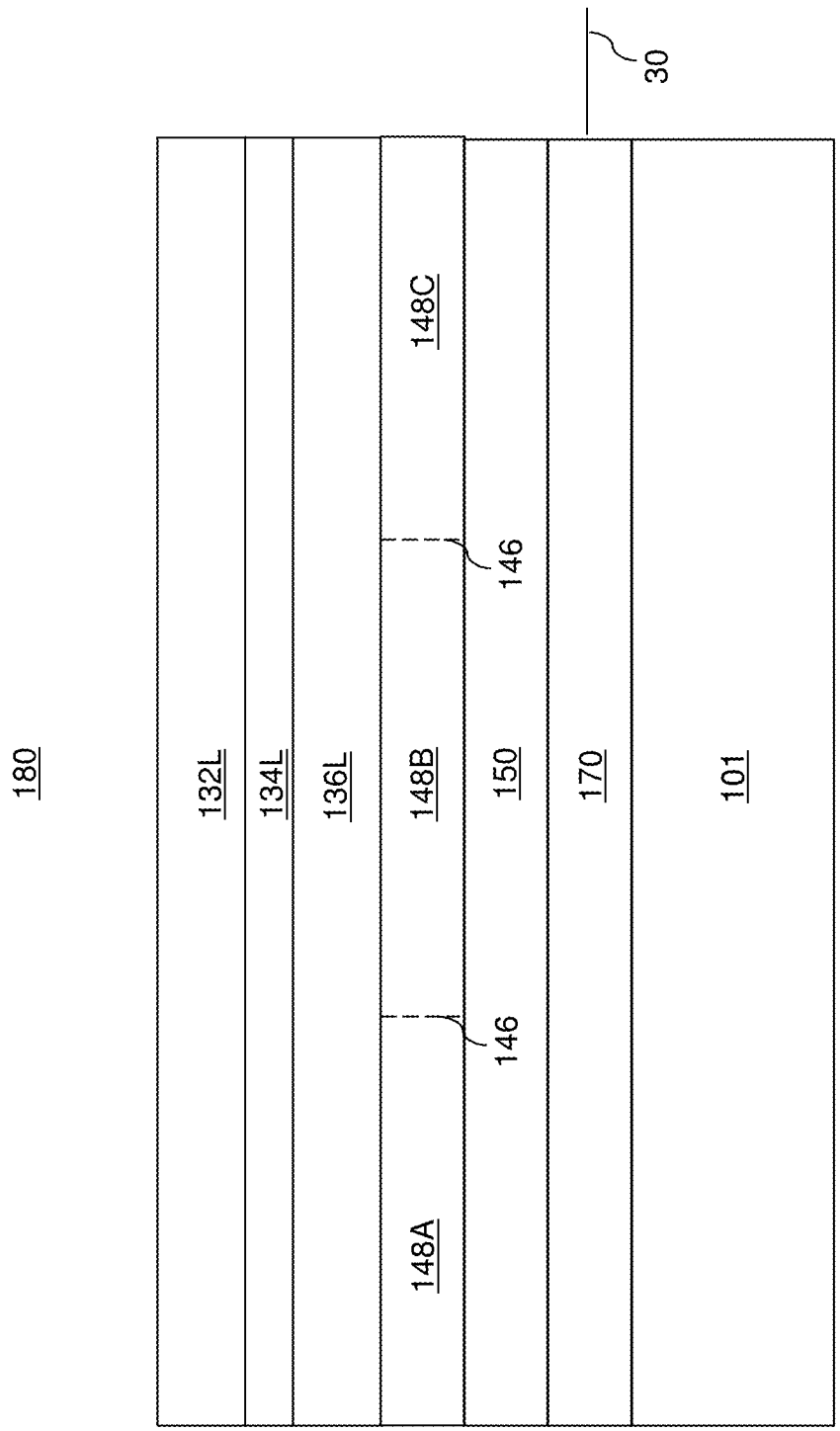

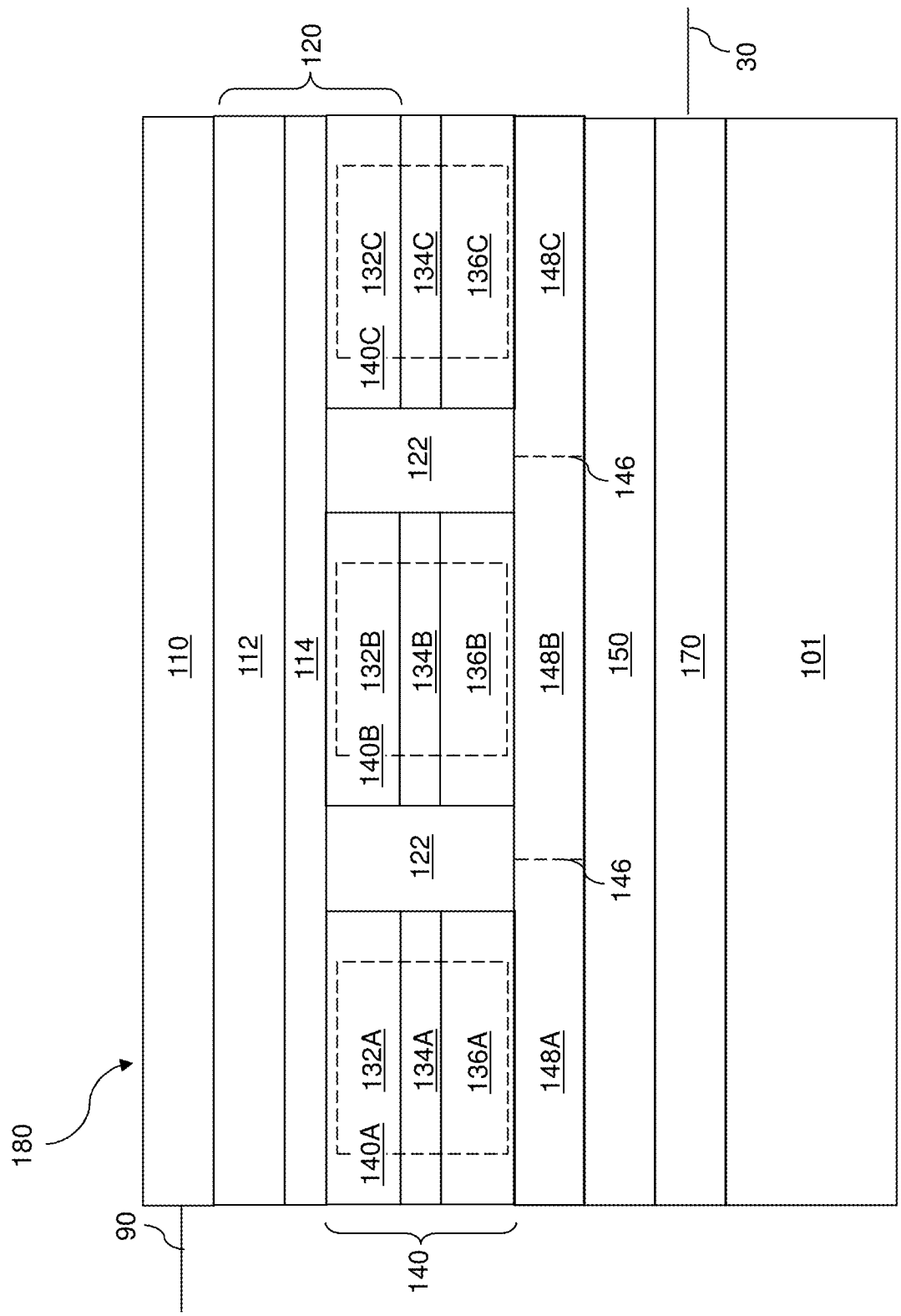

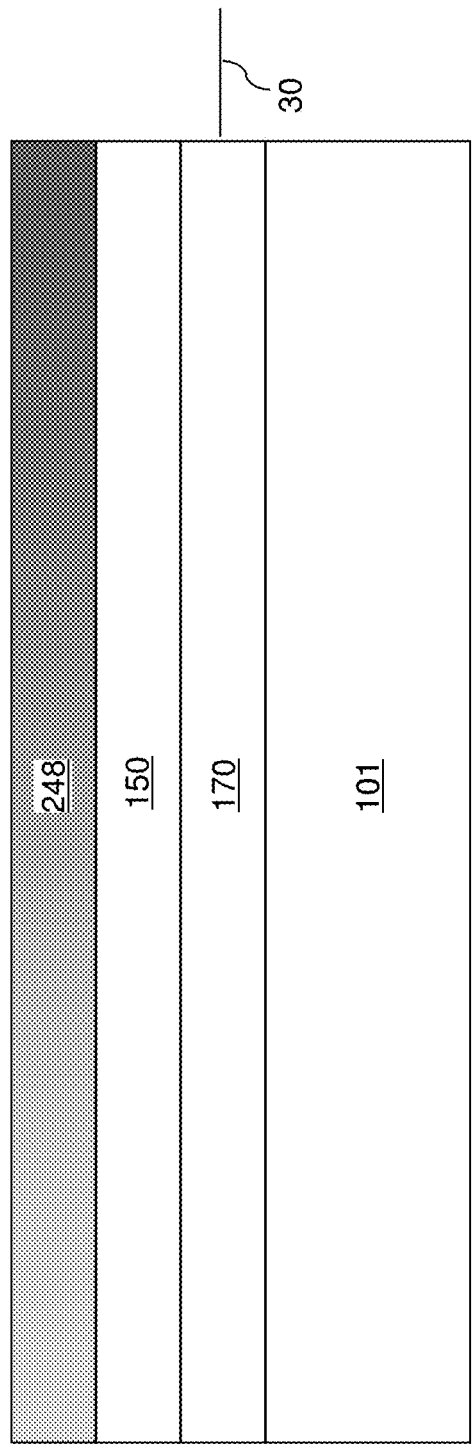

MAGNETIC DEVICE INCLUDING MULTIFERROIC REGIONS AND METHODS OF FORMING THE SAME

FIELD

The present disclosure relates generally to the field of magnetic (e.g., spintronic) devices and specifically to a magnetoresistive memory device including magnetoelectric multiferroic regions and methods of forming the same.

BACKGROUND

Spin-transfer torque (STT) refers to an effect in which the orientation of a magnetic layer in a magnetic tunnel junction or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic tunnel junction or a spin valve, the electrons in the spin-polarized current can transfer at least some of their angular momentum to the free layer, thereby producing a torque on the magnetization of the free layer. When a sufficient amount of spin-polarized current passes through the free layer, spin-transfer torque can be employed to flip the orientation of the spin (e.g., change the magnetization) in the free layer. A resistance differential of a magnetic tunnel junction between different magnetization states of the free layer can be employed to store data within the magnetoresistive random access memory (MRAM) cell depending if the magnetization of the free layer is parallel or antiparallel to the magnetization of the polarizer layer, also known as a reference layer.

SUMMARY

According to an aspect of the present disclosure, a magnetic device includes a first electrode, a second electrode, a plurality of magnetic junctions each containing a ferromagnetic reference layer and a ferromagnetic free layer located between the first electrode and the second electrode, and a plurality of magnetoelectric multiferroic portions having different structural defect densities located between the first electrode and the second electrode. Each of the plurality of magnetoelectric multiferroic portions is magnetically coupled to the ferromagnetic free layer of a respective one of the plurality of magnetic junctions.

According to yet another aspect of the present disclosure, a method of forming a magnetic device comprises forming a bottom electrode, forming a continuous magnetoelectric multiferroic layer over the bottom electrode, forming a plurality of magnetoelectric multiferroic portions in the continuous magnetoelectric multiferroic layer by structurally damaging different portions of the continuous magnetoelectric multiferroic layer with different structural defect densities, forming a plurality of magnetic junctions located over or under the plurality of magnetoelectric multiferroic portions, wherein each of the magnetic junctions comprises a respective reference layer and a respective free layer contacting a respective one of the magnetoelectric multiferroic portions, and forming a top electrode over the bottom electrode, the plurality of magnetoelectric multiferroic portions and the plurality of magnetic junctions.

BRIEF DESCRIPTION OF THE DRAWINGS

FIG. 2C is a vertical cross-sectional view of the first exemplary structure after formation of a magnetic tunnel junction according to the first embodiment of the present disclosure.

FIG. 2D is a vertical cross-sectional view of the first exemplary structure after dividing the magnetic tunnel junction into a plurality of magnetic tunnel junctions and after formation of a top electrode according to the first embodiment of the present disclosure.

FIG. 3B is a vertical cross-sectional view of the second exemplary structure after formation of a plurality of magnetoelectric multiferroic portions with ion bombardment according to the second embodiment of the present disclosure.

DETAILED DESCRIPTION

Figure 1:
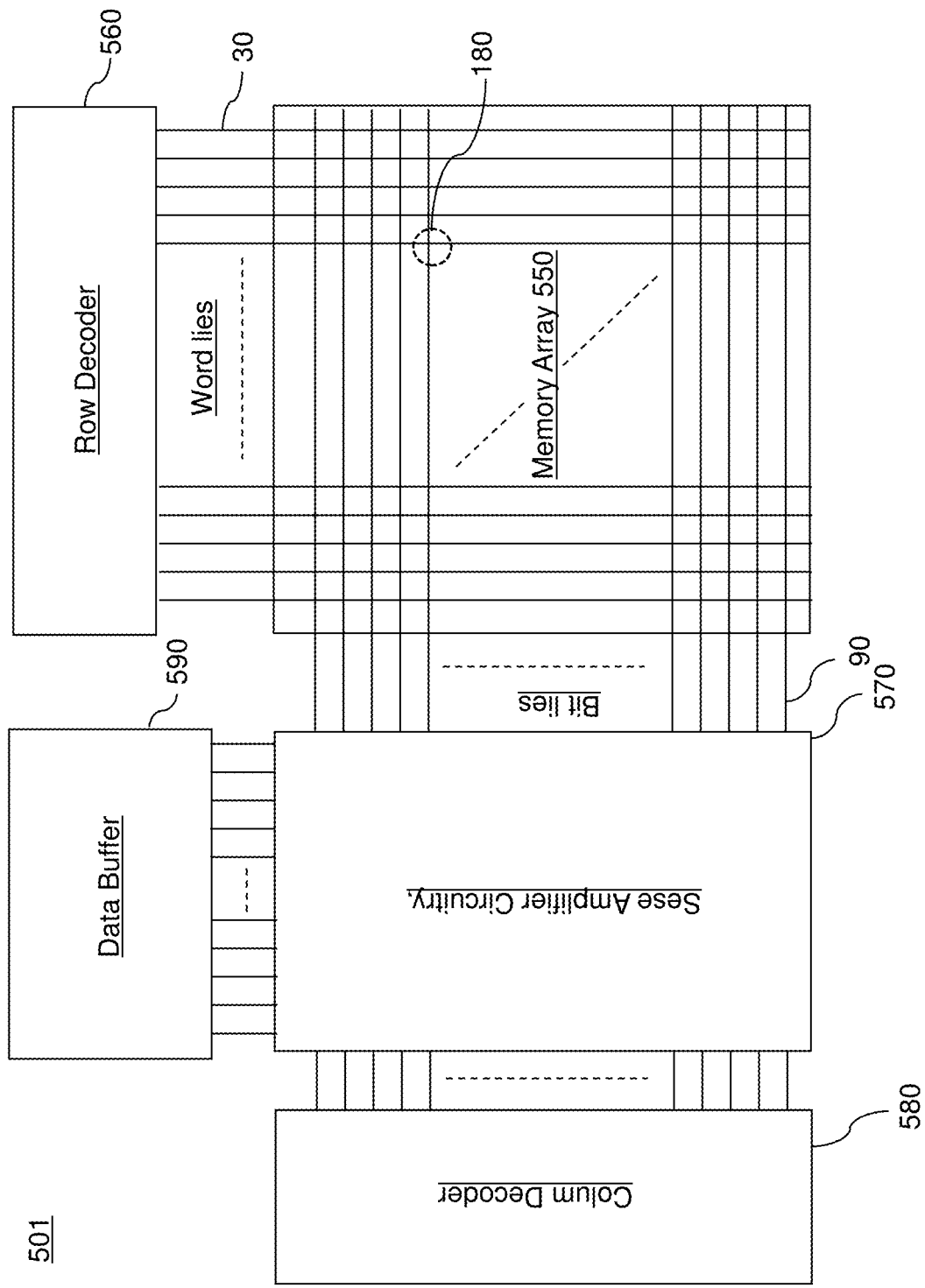
FIG. 1 is a schematic diagram of a random access array of magnetic tunnel junction devices according to an embodiment of the present disclosure.

As discussed above, embodiments of the present disclosure are directed to a magnetic device including multistate magnetic junction employing magnetoelectric multiferroic regions and methods of forming the same, the various aspects of which are described in detail herebelow. Specific embodiments of the present disclosure provide various spintronic devices having three or more magnetoresistive states that differ from each other The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow. As used herein, a "layer stack" refers to a stack of layers. As used herein, a "line" or a "line structure" refers to a layer that has a predominant direction of extension, i.e., having a direction along which the layer extends the most. As used herein, a "ferroelectric material" refers to any material that exhibits spontaneous ferroelectric polarization that can be reversed by the application of an external electric field (e.g., exhibits ferroelectricity). As used herein, a "multiferroic" material refers to a material that exhibits at least two of a ferromagnetic-type order (such as ferromagnetism, antiferromagnetism, or ferrimagnetism), ferroelectricity, and ferroelasticity. As used herein, a "magnetoelectric multiferroic" refers to a material that exhibits a ferromagnetic-type order and ferroelectricity. A change in total magnetization is coupled to a change in total ferroelectric polarization in a magnetoelectric multiferroic material, and thus, a change in a magnetic moment direction of the material can be coupled to a change in the ferroelectric polarization direction and vice versa.

FIG. 1 is a schematic diagram of a random access memory device 501 of magnetic tunnel junction devices 180 according to an embodiment of the present disclosure. As used herein, a "random access memory device" refers to a memory device including memory cells that allow random access, i.e., access to any selected memory cell upon a command for reading the contents of the selected memory cell.

The random access memory device 501 of the embodiments of the present disclosure may comprise an MRAM device, such as a multistate STT-type MRAM device containing multiferroic portions. The device 501 includes a memory array region 550 containing an array of the respective magnetic devices, such as magnetic tunnel junction devices (e.g., magnetoresistive memory cells) 180 located at intersections of word lines (which may comprise first electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). For example, the first electrically conductive lines 30 may be electrically connected to, and/or may comprise, bottom electrodes of a respective row of magnetic tunnel junction devices 180 in the memory array region 550, while the second electrically conductive lines 90 may be electrically connected to, and/or may comprise, top electrodes of a respective column of magnetic tunnel junction devices 180 in the memory array region 550.

The random access memory device 501 may also contain a row decoder 560 connected to the word lines, a sense circuitry 570 (e.g., a sense amplifier and other bit line control circuitry) connected to the bit lines, a column decoder 580 connected to the bit lines, and a data buffer 590 connected to the sense circuitry. The magnetic tunnel junction devices 180 are provided in an array configuration that forms the random access memory device 501. In one embodiment, the magnetic tunnel junction devices 180 may be provided as a rectangular array. As such, each of the magnetic tunnel junction devices 180 can be a two-terminal device including a respective first electrode and a respective second electrode. It should be noted that the location and interconnection of elements are schematic, and the elements may be arranged in a different configuration. Further, a magnetic tunnel junction device 180 may be manufactured as a discrete device, i.e., a single isolated device.

The embodiments of the present disclosure provide a nonvolatile memory element based on programmability of each of the magnetic tunnel junction devices 180 into a target magnetoresistive state among at least three possible magnetoresistive states. Thus, each of the magnetic tunnel junction devices 180 can be employed to store a ternary bit, a quaternary bit, a quinary bit, or a bit with six or more possible values. Further, the random access configuration illustrated in the random access memory device 501 is only exemplary, and the magnetic tunnel junction devices 180 of the embodiments of the present disclosure can be connected in different interconnection configurations.

Figure 2A:
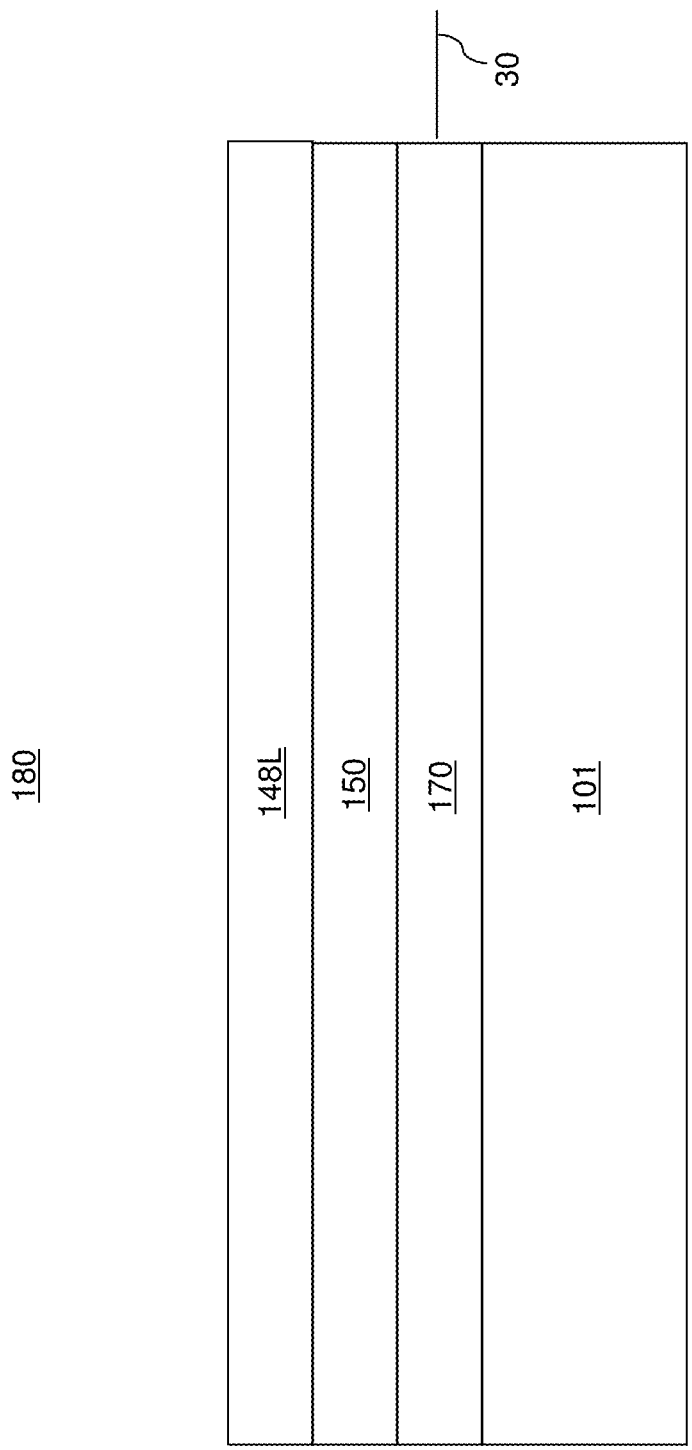
FIG. 2A is a vertical cross-sectional view of a first exemplary structure after formation of a continuous magnetoelectric multiferroic layer according to a first embodiment of the present disclosure.

Referring to FIG. 2A, a first exemplary structure for forming a magnetic tunnel junction device 180 is illustrated. The first exemplary structure includes an optional insulating material layer 101 that includes an insulating material such as undoped silicate glass, a doped silicate glass, organosilicate glass, silicon nitride, a dielectric metal oxide, or a combination thereof. In one embodiment, the insulating material layer 101 comprises an insulating substrate, such as a ceramic or a glass substrate. In another embodiment, the insulating material layer 101 can be provided over a semiconductor substrate (not shown) with semiconductor devices (not shown) such as field effect transistors thereupon. In this case, the insulating material layer 101 may include a plurality of interconnect-level dielectric material layers embedding metal interconnect structures therein. The metal interconnect structure can provide electrical connection between the semiconductor devices and to the first electrically conductive lines 30 and the second electrically conductive lines 90 that are formed above the insulating material layer 101. In this case, structural elements that are formed above the insulating material layer 101 may be embedded within a dielectric matrix (not expressly shown) that embeds the first electrically conductive lines 30 and the second electrically conductive lines.

A bottom electrode 170 can be formed in each area in which a magnetic tunnel junction device 180 is to be subsequently formed. The bottom electrode 170 may be formed as a portion of a first electrically conductive line 30, or may be formed as a discrete structure on top of a first electrically conductive line 30. The bottom electrode 170 can include at least one conductive metallic material such as a conductive metallic nitride material, an elemental metal, or an intermetallic alloy. In one embodiment, the at least one conductive metallic material can include a non-magnetic and non-ferroelectric metallic material such as TiN, TaN, WN, Ti, Ta, W, Cu, or a combination thereof. The thickness of the bottom electrode 170 can be in a range from 5 nm to 100 nm, although lesser and greater thicknesses may also be employed.

At least one optional capping layer 150 may be formed above the bottom electrode 170. The at least one optional capping layer 150 is optional, and thus, may, or may not, be employed. If employed, the at least one optional capping layer 150 may include a non-magnetic conductive capping layer and/or a dielectric capping layer. The non-magnetic conductive capping layer can include at least one non-magnetic electrically conductive material such as tantalum, ruthenium, tantalum nitride, copper, and/or copper nitride. For example, the non-magnetic conductive capping layer can comprise a single layer or a layer stack including, from one side to another, a first ruthenium layer, a tantalum layer, and a second ruthenium layer. For example, the first ruthenium layer can have a thickness in a range from 5 Angstroms to 15 Angstroms, the tantalum layer can have a thickness in a range from 10 Angstroms to 30 Angstroms, and the second ruthenium layer can have a thickness in a range from 5 Angstroms to 15 Angstroms. The dielectric capping layer can include, for example, a magnesium oxide capping layer having a thickness in a range from 4 Angstroms to 10 Angstroms, although lesser and greater thicknesses can also be employed. Thus, the magnesium oxide capping layer has a resistance-area product that is negligible or much smaller than the resistance-area product of the tunnel barrier layer to be subsequently formed. In this case, the magnetic tunnel junction device 180 can be formed as a single tunnel junction device that includes only one magnetic tunnel junction. If both the non-magnetic conductive capping layer and the dielectric capping layer are employed, the dielectric capping layer may overlie or underlie the non-magnetic conductive capping layer. The thickness of the at least one optional capping layer 150 may be in a range from 1 nm to 30 nm, although lesser and greater thicknesses can also be employed.

A continuous magnetoelectric multiferroic layer 148L can be formed over the at least one optional capping layer 150 and/or the bottom electrode 170. The continuous magnetoelectric multiferroic layer 148L may have a uniform initial structural defect density. As discussed above, a magnetoelectric multiferroic exhibits a ferromagnetic-type order and ferroelectricity, and change in total magnetization is coupled to a change in total ferroelectric polarization in a magnetoelectric multiferroic material, and thus, a change in magnetization/magnetic moment direction of the material can be coupled to a change in the ferroelectric polarization direction and vice versa. Therefore, the magnetization direction of the multiferroic material may be deterministically switched (i.e., programmed) by an application of a programming voltage across the material without applying an external magnetic field or a tunneling current through the magnetic tunnel junction that will be formed above the multiferroic layer 148L. Thus, the magnetic tunnel junction device 180 may be programmed by tunable electric field control of exchange coupling (EFCEC) with the magnetoelectric multiferroic material.

In one embodiment, the continuous magnetoelectric multiferroic layer 148L can be formed as a single crystalline material or as a polycrystalline material having multiple crystalline grains. In one embodiment, the single crystalline material of the continuous magnetoelectric multiferroic layer 148L can have a magnetization/magnetic moment direction and a ferroelectric polarization direction. The same relative spatial orientation between the magnetization/magnetic moment direction and the ferroelectric polarization direction can be the same throughout the continuous magnetoelectric multiferroic layer 148L. In another embodiment, each grain of the continuous magnetoelectric multiferroic layer 148L can have a respective magnetization/magnetic moment direction and a respective ferroelectric polarization direction, and a relative spatial orientation between the respective magnetization/magnetic moment and the respective ferroelectric polarization directions within each grain of the continuous magnetoelectric multiferroic layer 148L is the same.

The continuous magnetoelectric multiferroic layer 148L can be deposited by chemical vapor deposition, atomic layer deposition, pulsed laser deposition, or physical vapor deposition. The thickness of the continuous magnetoelectric multiferroic layer 148L can be in a range from 1 nm to 10 nm, such as from 1.5 nm to 5 nm, although lesser and greater thicknesses can also be employed. The continuous magnetoelectric multiferroic layer 148L can be formed as a continuous material layer having a same material composition and a same thickness throughout.

In one embodiment, the continuous magnetoelectric multiferroic layer 148L comprises, and/or consists essentially of, a multiferroic material selected from $BiFeO_3$, h-$YMnO_3$, $BaNiF_4$, $PbVO_3$, $BiMnO_3$, $LuFe_2O_4$, $HoMn_2O_5$, h-$HoMnO_3$, h-$ScMnO_3$, h-$ErMnO_3$, h-$TmMnO_3$, h-$YbMnO_3$, h-$LuMnO_3$, $K_2SeO_4$, $Cs_2CdI_4$, $TbMnO_3$, $Ni_3V_2O_8$, $MnWO_4$, $CuO$, $ZnCr_2Se_4$, $LiCu_2O_2$, or $Ni_3B_7O_{13}I$. Preferably the multiferroic material comprises an electrically insulating multiferroic material, such as $BiFeO_3$, which has antiferromagnetic spin arrangement and magnetic moment direction from spin canting.

Figure 2B:
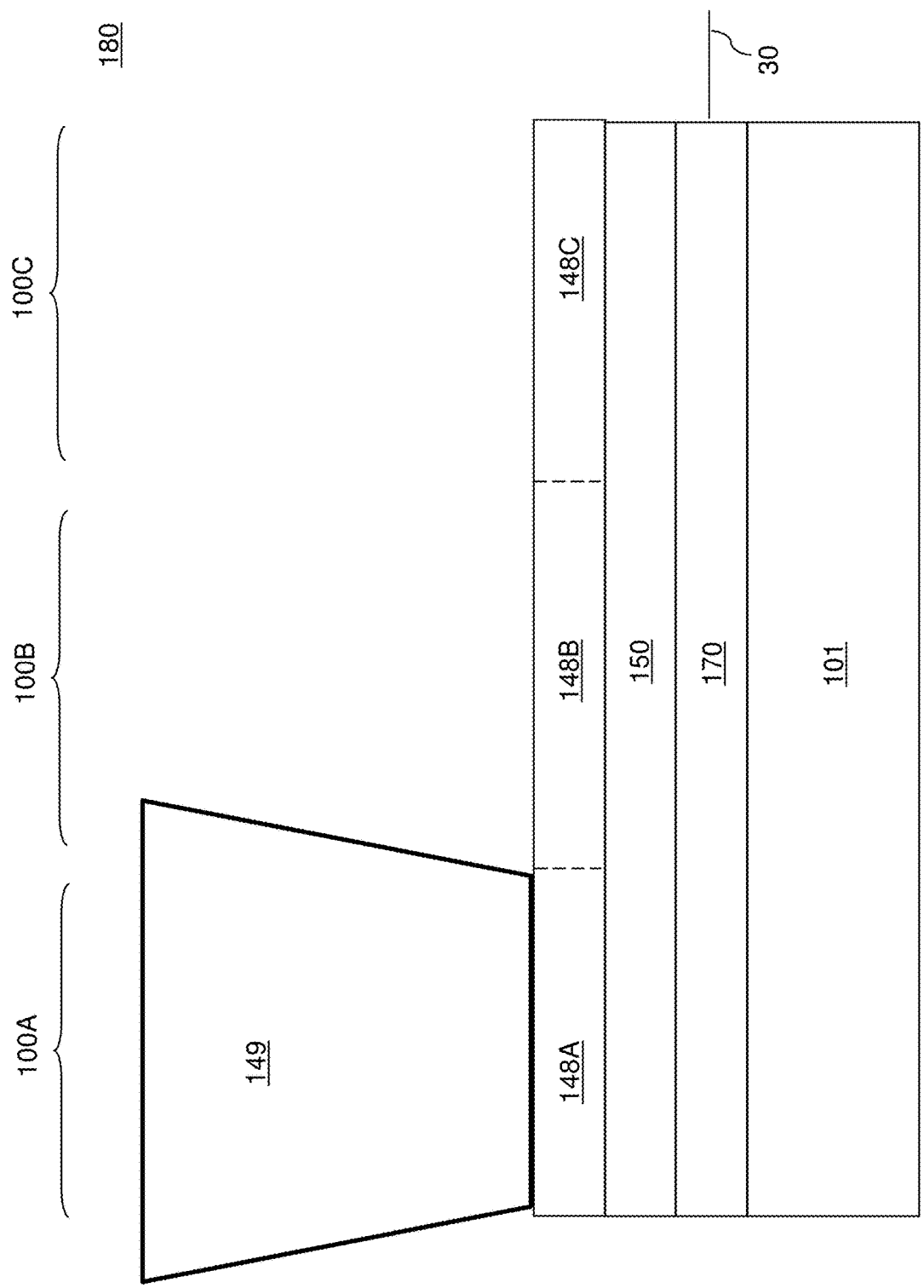
FIG. 2B is a vertical cross-sectional view of the first exemplary structure after formation of a plurality of magnetoelectric multiferroic portions with ion bombardment according to the first embodiment of the present disclosure.

Referring to FIG. 2B, at least three multiferroic portions 148A, 148B and 148C of the continuous magnetoelectric multiferroic layer 148L can be structurally damaged to form a different density of structural defects therein. For example, an area of the continuous magnetoelectric multiferroic layer 148L that corresponds to the area of a magnetic tunnel junction device 180 can be divided into multiple regions such as a first magnetic tunnel junction region 100A in which a first magnetic tunnel junction is to be subsequently formed above the first portion 148A of layer 148L, a second magnetic tunnel junction region 100B in which a second magnetic tunnel junction is to be subsequently formed above the second portion 148B of layer 148L, and a third magnetic tunnel junction region 100C in which a third magnetic tunnel junction is to be subsequently formed above the third portion 148C of layer 148L. More than three magnetic tunnel junction regions overlying more than three respective multiferroic portions of layer 148L may be formed.

Local ion bombardment processes, such as scanned focused ion beam (FIB) processes, may be subsequently performed to introduce a different density of structural defects in the magnetoelectric multiferroic portions (148A, 148B, 148C) located in different respective magnetic tunnel junction regions (100A, 100B, 100C).

In one embodiment, a focused ion beam (FIB) apparatus can be used to scan a first focused ion beam 149 along a first direction (e.g., in and/or out of the plane of FIG. 2B) one of the portions (e.g., regions) of the multiferroic layer 148L, such as the first portion 148. The first focused ion beam 149 has a sufficiently small first diameter at the point of impact on the multiferroic layer 148L, such that only the first portion 148A is irradiated with the ion beam. For example, the diameter may be 10 nm to 20 nm wide at the point of impact, and the first portion 148A may have a width in a second horizontal direction (e.g., left to right in FIG. 2B) of 10 nm to 20 nm. The first portion 148A has a substantially the same width as the diameter of the focused ion beam at the point of impact. A substantially the same width as used herein includes a width that is exactly the same as or within 10% of the focused ion beam diameter at the point of impact.

The focused ion beam has first ion dose, first beam energy and first beam dwell time. The dwell time comprises the time that the beam contacts a given unit area. The beam may be scanned along the first horizontal direction one or more times in the first portion. Thus, the dwell time is a function of at least the beam scanning speed and the number of passes (i.e., scans) in the portion. The energy of the focused ion beam may be in a range from 1 keV to 300 keV, such as from 5 keV to 50 keV, although lesser and greater ion beam energies can also be employed. The dose of the focused ion beam may be in a range from $1.0 \times 10^{12}$ atoms/cm$^2$ to $1.0 \times 10^{15}$ atoms/cm$^2$, although lesser and greater doses can also be employed. The atomic species of the ion beam may be any element that may be employed in a focused ion beam. For example, the atomic species of the ions in the focused ion beam may include, and/or may consist essentially of, helium or gallium.

The ions that impinge on the portion 148A of the multiferroic layer 148L induce structural damage therein. Specifically, the focused ion beam irradiation processes results in at least one of a first density of broken bonds in the multiferroic portion, a first density of displaced atoms in a crystal lattice of the multiferroic portion, and/or a first density of gallium or helium atoms implanted into (i.e., implanted ion concentration) the multiferroic portion.

Without wishing to be bound by a particular theory, it is believed that the broken bonds block domain walls in the scanned multiferroic portion, which requires a higher applied voltage (i.e., programming voltage) to switch the polarization state of the portion. Thus, a higher applied voltage is required to also switch the magnetization/magnetic moment direction of the multiferroic portion. The percentage shift in the applied voltage (e.g., coercive electrical field) depends on the degree of structural damage (i.e., density of broken bonds) in the multiferroic material of the damaged portion.

The displaced atoms are displaced from their equilibrium positions to metastable positions in the crystal lattice that effectively retard change in the electrical dipole moment within the multiferroic material. In other words, the multiferroic layer 148L portion with displaced atoms does not lose its multiferroic property, but the displacement of one or more atoms from the normal position within a unit cell structure of the crystal lattice retards switching of the direction of the electrical dipole moment by requiring buildup of more energy for switching of the direction of the electrical dipole moment. Thus, the hysteresis curve of the multiferroic portion is modified from the hysteresis curve of the undamaged portion by increasing the magnitude of the applied voltage (e.g., coercive electrical field) that is needed to switch the direction of polarization of the portion (and thus to switch the magnetization/magnetic moment direction). The percentage shift in the applied voltage (e.g., coercive electrical field) depends on the degree of structural damage (i.e., density of displaced atoms) in the multiferroic material of the damaged portion.

Likewise, implantation of the helium or gallium atoms of the focused ion beam into the multiferroic portion causes a disruption to the crystal lattice of the portion containing the helium or gallium atoms. This disruption causes an increase in the applied voltage (e.g., coercive electrical field) required to switch the polarization direction (and thus the magnetization/magnetic moment direction) of the implanted portion. The percentage shift in the applied voltage (e.g., coercive electrical field) depends at least in part on the concentration of implanted helium or gallium ions (i.e., density of implanted atoms) in the multiferroic material of the damaged portion.

A second focused ion beam (not shown for clarity) is scanned over the second portion 148B of the multiferroic layer 148L. The second focused ion beam has a second beam diameter at the point of impact on layer 148L, a second ion dose, a second beam energy and second beam dwell time.

In one embodiment, the second focused ion beam diameter at the point of impact on layer 148L is substantially the same as the width of the second portion 148B and is scanned only over the second portion 148B. In this embodiment, at least one of the second ion dose, the second beam energy, and/or the second beam dwell time is less than the respective first ion dose, first beam energy, and/or first beam dwell time.

In another embodiment, the second focused ion beam diameter at the point of impact on layer 148L is substantially the same as the width of the sum of the first portion 148A and the second portion 148B in the second horizontal direction (e.g., left to right in FIG. 2B). In this embodiment, the second focused ion beam is scanned over the first portion 148A and the second portion 148B at the same time. In this embodiment, the second ion dose, the second beam energy and/or the second beam dwell time may be the same as the respective first ion dose, second beam energy and/or first beam dwell time. The first portion 148A is scanned twice (i.e., by the first and second ion beams) while the second portion 148B is scanned once (i.e., only by the second ion beam).

In both of these embodiments, the first portion 148A has a higher density of structural defects than the second portion 148B. In other words, the first portion 148A has a higher density of broken bonds in the multiferroic layer, a higher density of displaced atoms in a crystal lattice of the multiferroic layer, and/or a higher density of gallium or helium atoms, than the second portion 148B.

The third portion 148C may remain unscanned by any focused ion beam. Thus, the third portion 148C has the lowest density of structural defects of any portion. In other words, the third portion 148C has a lower density of structural defects noted above than the first or second portions. Thus, the lowest applied voltage (i.e., programming voltage) is required to switch the polarization and magnetization directions of the third portion 148C.

While three portions (148A, 148B, 148C) and two ion beams are described above, any number of two or more portions with different density of structural defects may be used. Furthermore, any suitable number of focused ions beams may be used to form the different density of structural defects in the respective portions. Finally, while a focused ion beam was described above, any other suitable method of forming structural defects in the portions may be used instead.

The implanted gallium or helium ions may pass through the multiferroic layer 148L, may remain in the multiferroic layer 148L and/or may be volatilized (for example, in case helium atoms are implanted). The various portions (148A, 148B, 148C) of the multiferroic layer 148L can have a same material composition if they have the same helium or gallium concentration, or they may have a different composition if they have a different helium or gallium concentration. In one embodiment, the structural defect densities (e.g., density of broken bonds, displaced atoms and/or implanted atoms) in the various portions (148A, 148B, 148C) of the multiferroic layer 148L can be in a range from $5.0 \times 10^{16}/cm^3$ to $5.0 \times 10^{21}/cm^3$, such as from $1.0 \times 10^{18}/cm^3$ to $2.5 \times 10^{21}/cm^3$, although lesser and greater defect densities can also be employed. The average displacement distance of displaced atoms (which provide the structural defects) can be in a range from 0.01 nm to 0.1 nm, although lesser and greater average displacement distances can also be employed. Due to the separate focused ion beam scans, distinct boundaries 146 may be present between adjacent magnetoelectric multiferroic portions (148A, 148B, 148C).

Generally, a plurality of magnetoelectric multiferroic portions (148A, 148B, 148C) can be formed in the continuous magnetoelectric multiferroic layer 148L by structurally damaging different portions of the continuous magnetoelectric multiferroic layer 148L with different structural defect densities through bombardment with ions. The magnetoelectric multiferroic portions (148A, 148B, 148C) are formed over the bottom electrode 170, and have different structural defect densities. The plurality of magnetoelectric multiferroic portions (148A, 148B, 148C) can comprise a minimum-defect-density magnetoelectric multiferroic portion (such as the third magnetoelectric multiferroic portion 148C) having a minimum structural defect density of all structural defect densities of the plurality of magnetoelectric multiferroic portions (148A, 148B, 148C), and a maximum-defect-density magnetoelectric multiferroic portion (such as the first magnetoelectric multiferroic portion 148A) having a maximum structural defect density of all structural defect densities of the plurality of magnetoelectric multiferroic portions (148A, 148B, 148C). In one embodiment, the maximum structural defect density can be at least five times the minimum structural defect density. For example, the minimum structural defect density can be in a range from $1.0 \times 10^{12}/cm^3$ to $1.0 \times 10^{18}/cm^3$, and the maximum structural defect density can be in a range from $5.0 \times 10^{15}/cm^3$ to $5.0 \times 10^{21}/cm^3$. In one embodiment, the structural defect density of a magnetoelectric multiferroic portion (such as the magnetoelectric multiferroic portion within the highest defect density) of the plurality of magnetoelectric multiferroic portions (148A, 148B, 148C) may be in a range from $5.0 \times 10^{19}/cm^3$ to $5.0 \times 10^{21}/cm^3$.

In one embodiment, the plurality of magnetoelectric multiferroic portions (148A, 148B, 148C) have different electrical coercivities, and for each pair of a magnetoelectric multiferroic portion 148B and an additional magnetoelectric multiferroic portion 148A having a higher structural defect density, the additional magnetoelectric multiferroic portion 148A has a higher electrical coercivity than the magnetoelectric multiferroic portion 148B.

Referring to FIG. 2C, a magnetic tunnel junction (136L, 134L, 132L) can be formed over the plurality of magnetoelectric multiferroic portions (148A, 148B, 148C) by sequentially depositing a free layer 136L, a tunnel barrier layer 134L, and a reference layer 132L.

The free layer 136L can be formed as single ferromagnetic material layer or multiple ferromagnetic material layers that are magnetically coupled among one another to provide a same magnetization direction throughout. The thickness of the free layer 136L is less than 2 nm, and preferably less than 1.5 nm, such as from 0.8 nm to 1.5 nm. For example, the free layer 136L can include a CoFeB layer and/or a CoFe layer.

The tunnel barrier layer 134L can include a tunnel barrier dielectric material such as magnesium oxide. The tunnel barrier layer 134L can have a thickness in a range from 0.6 nm to 3 nm, such as from 0.8 nm to 2 nm.

The reference layer 132L can be formed as single ferromagnetic material layer or multiple ferromagnetic material layers that are magnetically coupled to each other to provide a same magnetization direction throughout. The reference layer 132L may include a Co/Ni multilayer structure or a Co/Pt multilayer structure. In one embodiment, the reference layer 132L can additionally include a thin non-magnetic layer comprised of tantalum or tungsten having a thickness of 0.2 nm~0.5 nm and a thin CoFeB layer (having a thickness in a range from 0.5 nm to 3 nm). The thickness of the reference layer 132L can be in a range from 2 nm to 5 nm.

In one embodiment, the reference layer 132L and the free layer 136L have respective positive uniaxial magnetic anisotropy. Positive uniaxial magnetic anisotropy is also referred to as perpendicular magnetic anisotropy (PMA) in which a minimum energy preference for quiescent magnetization is along the axis perpendicular to the plane of the magnetic film.

The configuration in which the reference layer 132L and the free layer 136L have respective perpendicular magnetic anisotropy provides bistable magnetization states for the free layer 136L. The bistable magnetization states include a parallel state in which the free layer 136L has a magnetization (e.g., magnetization direction) that is parallel to the fixed vertical magnetization (e.g., magnetization direction) of the reference layer 132L, and an antiparallel state in which the free layer 136L has a magnetization (e.g., magnetization direction) that is antiparallel to the fixed vertical magnetization (e.g., magnetization direction) of the reference layer 132L. The fractional resistance change between parallel (P) and antiparallel (AP) alignment (i.e., orientation) of the magnetization directions of each pair of vertically adjoining portions of the free layer 136L and the reference layer 132L is called tunnel magnetoresistance (TMR), i.e., $TMR = (R_{AP} - R_P)/R_P$.

Referring to FIG. 2D, the stack of the free layer 136L, the tunnel barrier layer 134L, and the reference layer 132L can be patterned, for example, by applying a photoresist layer (not shown) over the reference layer 132L, by patterning the photoresist layer to form gaps between each neighboring pair of magnetic tunnel junction regions (100A, 100B, 100C), and by transferring the pattern in the photoresist layer through the stack of the free layer 136L, the tunnel barrier layer 134L, and the reference layer 132L employing an anisotropic etch process. The stack of the free layer 136L, the tunnel barrier layer 134L, and the reference layer 132L is divided into multiple portions within each area of a magnetic tunnel junction device 180. Thus, the magnetic tunnel junction formed by the free layer 136L, the tunnel barrier layer 134L, and the reference layer 132L is divided into a plurality of magnetic tunnel junctions 140 within each area of a magnetic tunnel junction device 180. For example, the plurality of magnetic tunnel junctions 140 include a first magnetic tunnel junction 140A including a first free layer 136A, a first tunnel barrier layer 134A, and a first reference layer 132A; a second magnetic tunnel junction 140B including a second free layer 136B, a second tunnel barrier layer 134B, and a second reference layer 132B; and a third magnetic tunnel junction 140C including a third free layer 136C, a third tunnel barrier layer 134C, and a third reference layer 132C. In this case, the plurality of magnetic tunnel junctions 140 comprise discrete magnetic tunnel junctions 140 that do not directly contact one another. A dielectric material, such as silicon oxide or aluminum oxide can be deposited in the gaps between the plurality of magnetic tunnel junctions 140 to form dielectric isolation walls 122 between the adjacent magnetic tunnel junctions 140. The dielectric isolation walls 122 have an areal overlap with the boundaries 146 between the multiferroic regions. A common top electrode 110 is formed over the magnetic tunnel junctions 140.

In an alternative embodiment, since the focused ion beam will generally not cause significant damage to the magnetic tunnel junctions 140 and/or the common top electrode 110, the focused ion beam irradiation may be performed after patterning of the device shown in FIG. 2D. In other words, the focused ion beam 149 shown in FIG. 2B may be irradiated through the magnetic tunnel junctions 140 and/or through the common top electrode 110 to reach the magnetoelectric multiferroic portions (148A, 148B, 148C).

Generally, the plurality of magnetic tunnel junctions 140 can be formed over the plurality of magnetoelectric multiferroic portions (148A, 148B, 148C). Each magnetic tunnel junction (140A, 140B, 140C) can be formed on a respective one of the magnetoelectric multiferroic portions (148A, 148B, 148C) in the respective magnetic tunnel junction regions (100A, 100B, 100C). For example, a first magnetic tunnel junction 140A can be formed on a first magnetoelectric multiferroic portion 148A in region 100A, a second magnetic tunnel junction 140B can be formed on a second multiferroic portion 148B in region 100B, and a third magnetic tunnel junction 140C can be formed on a third multiferroic portion 148C in region 100C. Each of the magnetic tunnel junctions 140 comprises a respective reference layer (132A, 132B, or 132C), a respective tunnel barrier layer (134A, 134B, or 134C), and a respective free layer (136A, 136B, 136C) contacting a respective one of the magnetoelectric multiferroic portions (148A, 148B, 148C).

In one embodiment, the reference layers (132A, 132B, 132C) may be provided as a component within a common synthetic antiferromagnetic structure (SAF structure) 120. In this case, an antiferromagnetic coupling layer 114 and a fixed (or "hard") ferromagnetic layer 112 can be formed over the reference layers (132A, 132B, 132C). The SAF structure 120 can include the ferromagnetic layer 112, the antiferromagnetic coupling layer 114, and the reference layers (132A, 132B, 132C). The antiferromagnetic coupling layer 114 has a thickness that induces a strong antiferromagnetic coupling between the reference layers (132A, 132B, 132C) and the common fixed ferromagnetic layer 112, such that the antiferromagnetic coupling layer 114 can "lock in" antiparallel alignment of magnetizations between the ferromagnetic layer 112 and the reference layers (132A, 132B, 132C), which in turn "locks in" a particular (fixed) vertical direction of the magnetizations of the reference layers (132A, 132B, 132C). In this case, each of the reference layers (132A, 132B, 132C) can have a same magnetization direction, which may be an up direction or a down direction.

Figure 2E:
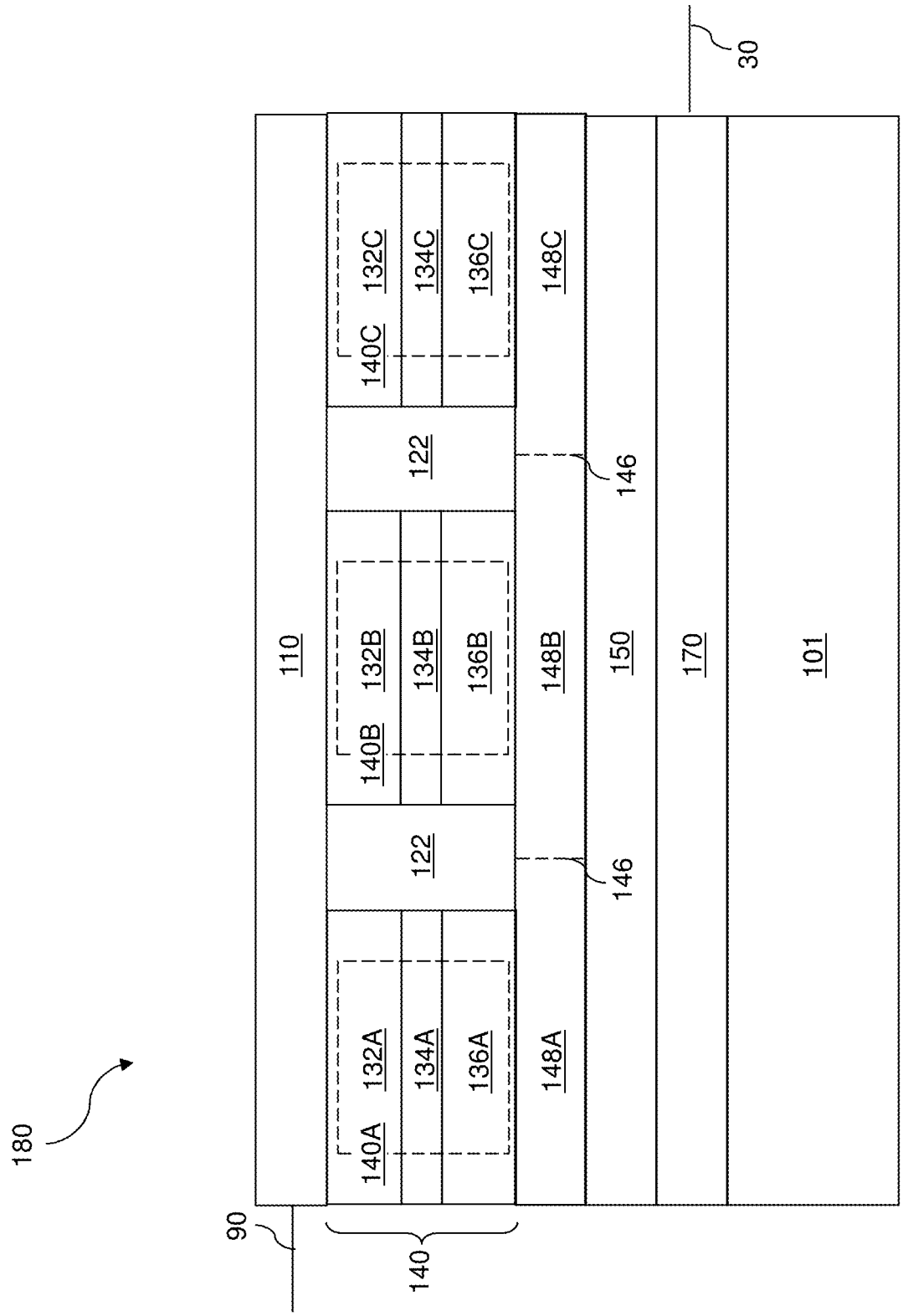
FIGS. 2E and 2F are vertical cross-sectional views of alternative configurations of the first exemplary structure according to the first embodiment of the present disclosure.

In an alternative embodiment illustrated in FIG. 2E, the common SAF structure 120 may be omitted and the reference layers (132A, 132B, 132C) may be provided as unpinned reference layers. In this alternative embodiment, the antiferromagnetic coupling layer 114 and the ferromagnetic layer 112 are omitted (i.e., the SAF 120 is omitted). In this alternative embodiment, the common top electrode 110 is formed on the top surface of the reference layers (132A, 132B, 132C). The ferromagnetic reference layers (132A, 132B, 132C) may remain unpinned, while the ferromagnetic free layers (136A, 136B, 136C) are pinned by the magnetoelectric multiferroic portions (148A, 148B, 148C) either in the parallel or antiparallel orientation with respect to the ferromagnetic reference layers (132A, 132B, 132C). In other words, the application of the programming voltage pins the magnetization direction of the ferromagnetic free layers (136A, 136B, 136C) in either the parallel or the antiparallel configuration with respect to the magnetization direction of the ferromagnetic reference layers (132A, 132B, 132C) to achieve either the low or high resistance state for each pair of reference and free layers (e.g., 132A and 136A, 132B and 136B and/or 132C and 136C).

As described above, the common top electrode 110 can be formed on the top surface of the fixed ferromagnetic layer 112 or on top of the reference layers (132A, 132B, 132C) (if the antiferromagnetic coupling layer 114 and the ferromagnetic layer 112 of the SAF 120 are omitted, as shown in FIG. 2E). Generally, the common top electrode 110 can be electrically connected to (e.g., electrically shorted to) each reference layer (132A, 132B, 132C) of the plurality of magnetic tunnel junctions 140. The top electrode 110 may be formed as a portion of a second electrically conductive line 90, or may be formed as a discrete structure over which a second electrically conductive line 90 is subsequently formed. The top electrode 110 can include at least one conductive metallic material such as a conductive metallic nitride material, an elemental metal, or an intermetallic alloy. In one embodiment, the at least one conductive metallic material can include a non-magnetic and non-ferroelectric metallic material such as TiN, TaN, WN, Ti, Ta, W, Cu, or a combination thereof. The thickness of the top electrode 110 can be in a range from 5 nm to 100 nm, although lesser and greater thicknesses may also be employed. Thus, the at least three separate magnetic tunnel junctions 140 of the same magnetic tunnel junction device 180 have common top and bottom electrodes.

While embodiments are described for forming a magnetic tunnel junction device 180 in which magnetic tunnel junctions 140 overlie magnetoelectric multiferroic portions (148A, 148B, 148C), embodiments are expressly contemplated herein in which the magnetoelectric multiferroic portions (148A, 148B, 148C) overlie the magnetic tunnel junctions 140. In this alternative embodiment, the layer stack from the at least one optional capping layer 150 to the fixed ferromagnetic layer 112 (or the reference layers 132A, 132B and 132C if layers 112 and 114 are omitted) are formed in reverse order to provide a magnetic tunnel junction device 180 in which the magnetoelectric multiferroic portions (148A, 148B, 148C) overlie the free layers (136A, 136B, 136C) of the magnetic tunnel junctions 140.

Figure 2F:
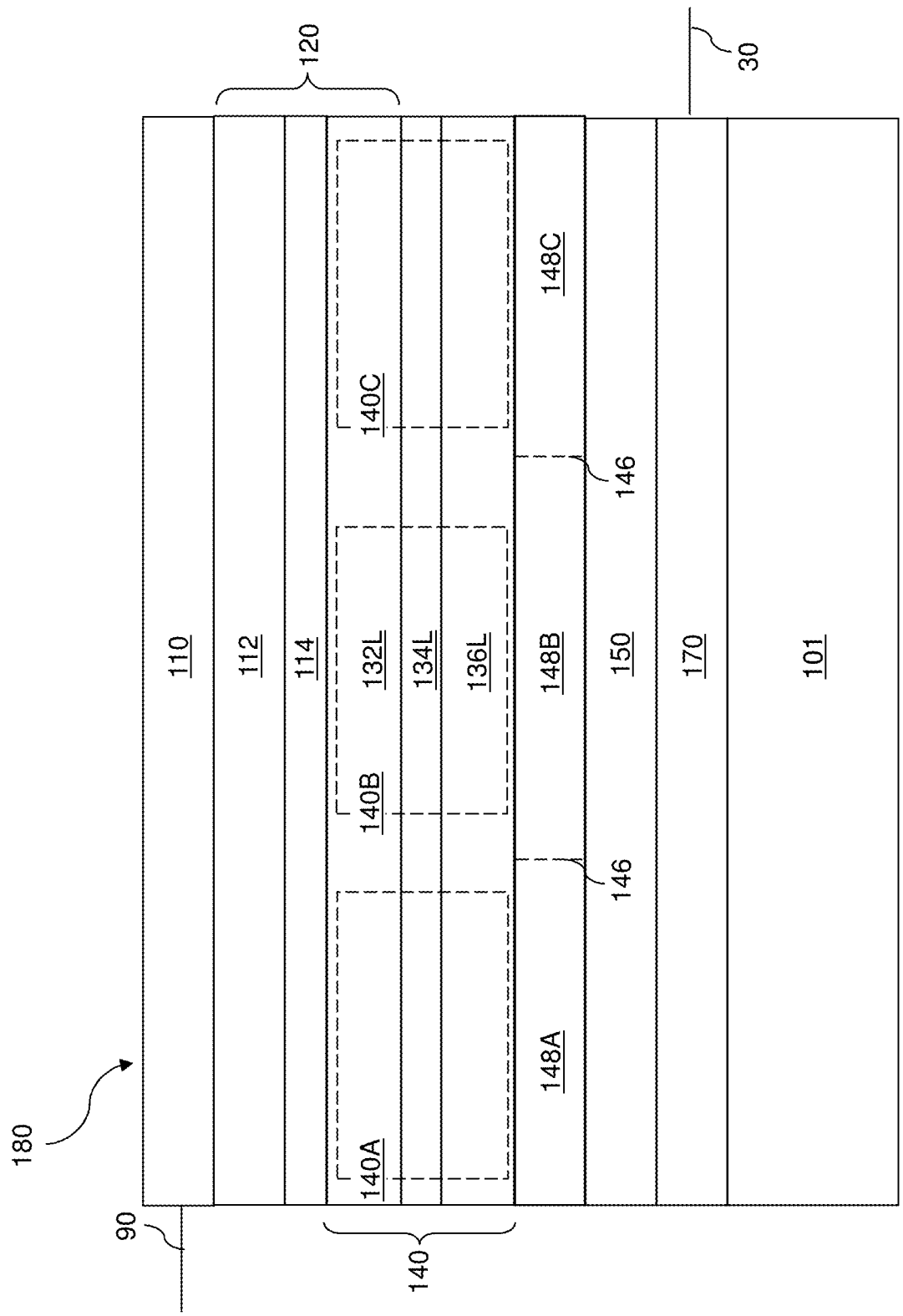

Referring to FIG. 2F, another alternative embodiment of the first exemplary structure can be derived from the first exemplary structure of FIG. 2C without dividing the stack of the stack of the free layer 136L, the tunnel barrier layer 134L, and the reference layer 132L within the area of a magnetic tunnel junction device 180. Instead, the magnetic tunnel junction device 180 comprises a single pillar structure containing at least one optional capping layer 150, the magnetoelectric multiferroic portions (148A, 148B, 148C), the free layer 136L, the tunnel barrier layer 134L, the reference layer 132L, the optional antiferromagnetic coupling layer 114, and the optional fixed ferromagnetic layer 112.

The stack of the free layer 136L, the tunnel barrier layer 134L, and the reference layer 132L includes a plurality of magnetic tunnel junctions (e.g., junction regions) 140, which include a first magnetic tunnel junction 140A overlying the first magnetoelectric multiferroic portion 148A, a second magnetic tunnel junction 140B overlying the second magnetoelectric multiferroic portion 148B, and a third magnetic tunnel junction 140C overlying the third magnetoelectric multiferroic portion 148C. A plurality of magnetic tunnel junctions 140 physically contact each other in the same magnetic tunnel junction device 180.

Figure 3A:
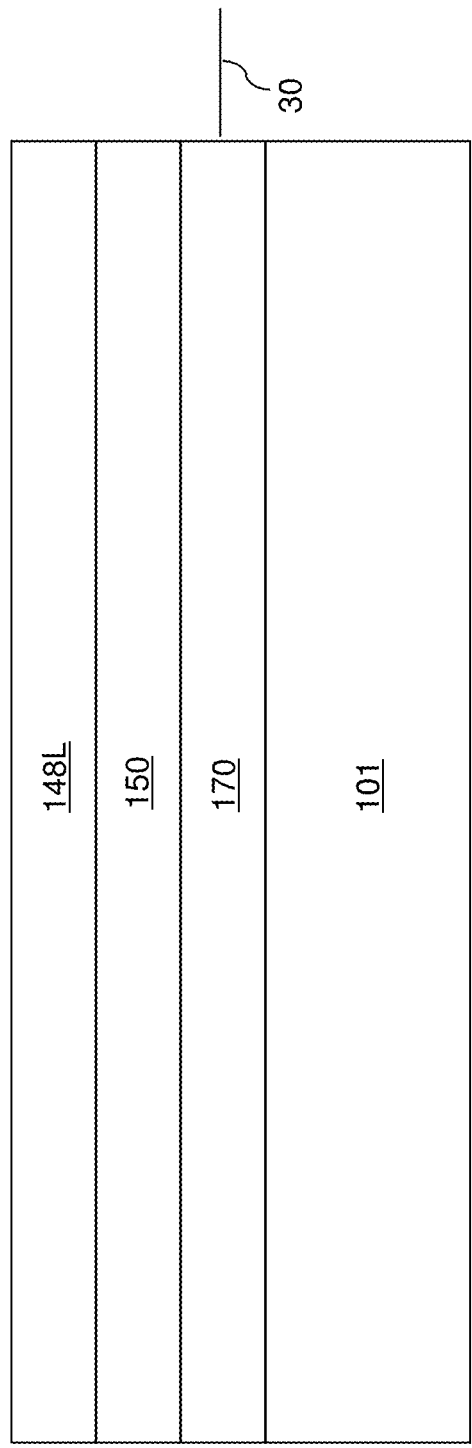
FIG. 3A is a vertical cross-sectional view of a second exemplary structure after formation of a continuous magnetoelectric multiferroic layer according to a second embodiment of the present disclosure.

Referring to FIG. 3A, a second exemplary structure for forming a magnetic tunnel junction device is illustrated, which may be the same as the first exemplary structure illustrated in FIG. 2A.

Referring to FIG. 3B, the multiferroic layer 148L is irradiated with a gradient focused ion beam which has at least one of a gradient ion dose, gradient beam energy and/or gradient beam dwell time. In other words, the focused ion beam irradiation is performed such that the ion dose, beam energy and/or beam dwell time varies gradually or in step wise manner between different areas of the multiferroic layer 148L. In one embodiment, the ion dose, beam energy and/or beam dwell time can vary monotonically from one side of the area of a magnetic tunnel junction device to another side of the area of the magnetic tunnel junction device. As used herein, a value of a function increases "monotonically" with a variable if, for any pair of a first value of the variable and a second value of the variable that is greater than the first value, the value of the function for the second value of the variable is always not less than the value of the function for the first value of the variable.

Magnetoelectric multiferroic portions having different structural defect densities are formed in the continuous magnetoelectric multiferroic layer 148L by structurally damaging different portions of the continuous magnetoelectric multiferroic layer 148L with different ion beam doses, beam energies and/or beam dwell times. In one embodiment, the focused ion beam irradiation can generate a graded structural defect density that laterally changes (e.g., monotonically laterally changes) from one side to another within the continuous magnetoelectric multiferroic layer 148L to form a graded-defect-density magnetoelectric multiferroic layer 248.

Generally, a plurality of magnetoelectric multiferroic portions having different structural defect densities can be formed in the continuous magnetoelectric multiferroic layer 148L by structurally damaging different portions of the continuous magnetoelectric multiferroic layer 148L to form different structural defect densities using focused ion beam irradiation. The plurality of magnetoelectric multiferroic portions can comprise a minimum-defect-density magnetoelectric multiferroic portion, and a maximum-defect-density magnetoelectric multiferroic portion. In one embodiment, the maximum structural defect density can be at least five times, such as five to twenty times the minimum structural defect density. The defect density may increase gradually (e.g., monotonically) from the minimum to the maximum across the multiferroic layer 248. For example, the minimum structural defect density can be in a range from $1.0\times10^{12}/cm^3$ to $1.0\times10^{18}/cm^3$, and the maximum structural defect density can be in a range from $5.0\times10^{19}/cm^3$ to $5.0\times10^{21}/cm^3$. In one embodiment, the plurality of magnetoelectric multiferroic portions can be portions within a single continuous magnetoelectric multiferroic layer, i.e., the graded-defect-density magnetoelectric multiferroic layer 248, having a graded structural defect density that laterally changes (e.g., monotonically changes) from one side to another. In this embodiment, there are no distinct boundaries between adjacent multiferroic regions 248_i in the graded-defect-density magnetoelectric multiferroic layer 248.

Figure 3C:
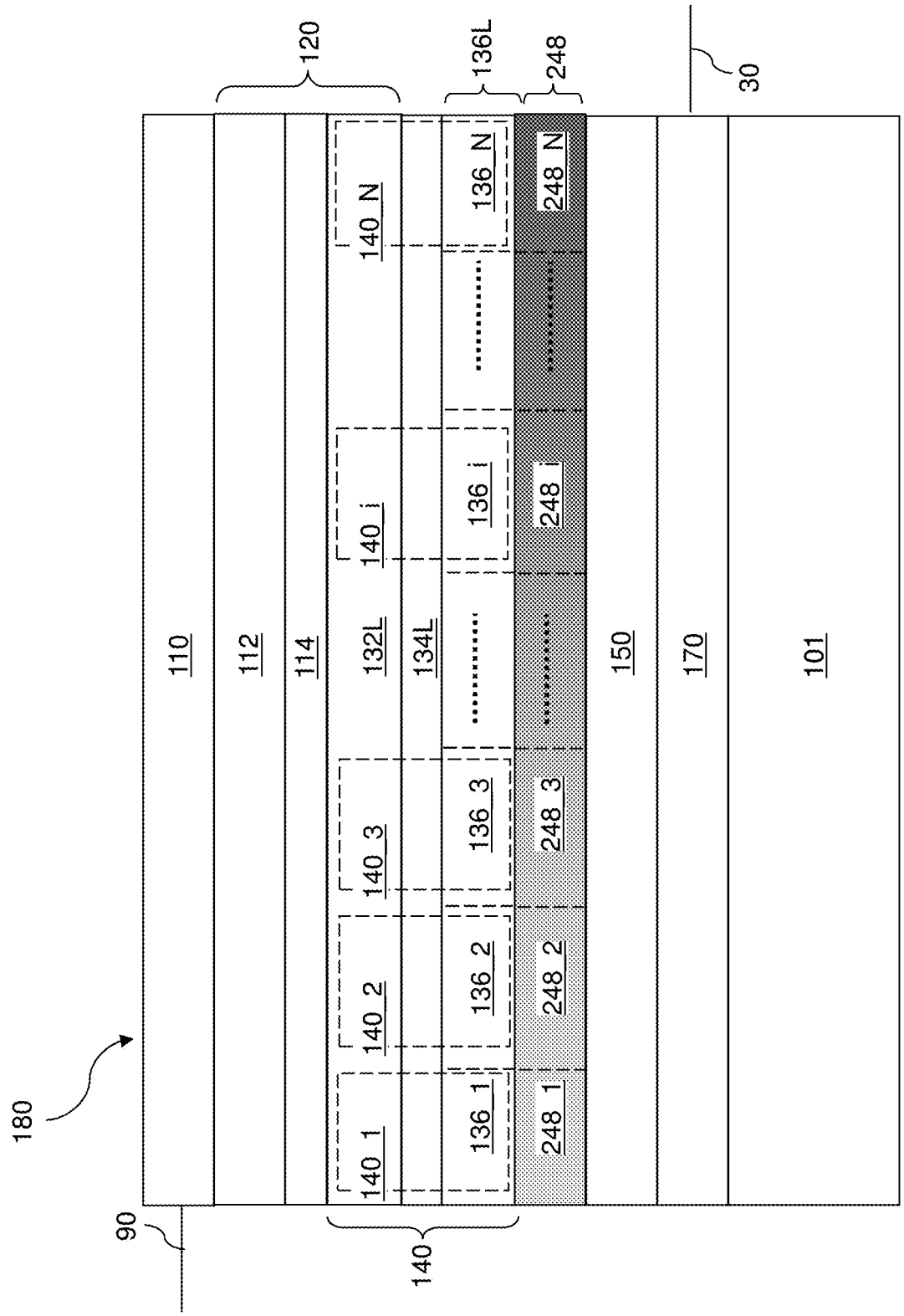
FIG. 3C is a vertical cross-sectional view of the second exemplary structure after formation of magnetic tunnel junctions and a top electrode according to the second embodiment of the present disclosure.

Referring to FIG. 3C, a free layer 136L, a tunnel barrier layer 134L, and a reference layer 132L can be sequentially deposited over the graded-defect-density magnetoelectric multiferroic layer 248. The free layer 136L is formed as a polycrystalline ferromagnetic film with grain boundaries between neighboring pairs of grains. In an illustrative example, the area of a magnetic tunnel junction device can include a free layer 136L with N grains. Each grain may have a diameter of 3 nm to 10 nm, such as 5 nm to 7 nm. The grain boundaries may function as domain walls and each grain ($136\_i$, $1 \leq i \leq N$) within the free layer 136L functions as an independent unit of magnetization and ferroelectric polarization, and functions independently of neighboring grain of the free layer 136L. In other words, the magnetization of each grain ($136\_i$, $1 \leq i \leq N$) can flip independently of the magnetizations of other grains ($136\_i$, $1 \leq i \leq N$) within the free layer 136L. As such, each combination of a grain ($136\_i$, $1 \leq i \leq N$) of the free layer 136L, a respective overlying portion of the tunnel barrier layer 134L, and respective overlying portion of the reference layer 132L constitutes a magnetic tunnel junction ($140\_i$, $1 \leq i \leq N$). A plurality of magnetic tunnel junctions ($140\_i$, $1 \leq i \leq N$) including a respective grain ($136\_i$, $1 \leq i \leq N$) within the free layer 136L can be formed. For example, if the portion of the free layer 136L within the area of a magnetic tunnel junction device 180 includes N grains, N magnetic tunnel junctions ($140\_i$, $1 \leq i \leq N$) can be formed. The number N may be, for example, in a range from 3 to 1,000.

Each region of the graded-defect-density magnetoelectric multiferroic layer 248 having an areal overlap with an overlying grain ($136\_i$, $1 \leq i \leq N$) of the free layer 136L is magnetically coupled to the magnetization of the overlying grain ($136\_i$, $1 \leq i \leq N$). As such, each region of the graded-defect-density magnetoelectric multiferroic layer 248 can include N magnetoelectric multiferroic portions ($248\_i$, $1 \leq i \leq N$). Thus, a plurality of stacks of a magnetoelectric multiferroic portion ($248\_i$, $1 \leq i \leq N$) and a magnetic tunnel junction ($140\_i$, $1 \leq i \leq N$) can be formed. For example, if N grains are present within the free layer 136L in the area of a magnetic tunnel junction device 180, N stacks of a magnetoelectric multiferroic portion ($248\_i$, $1 \leq i \leq N$) and a magnetic tunnel junction ($140\_i$, $1 \leq i \leq N$) can be formed in the magnetic tunnel junction device 180.

Generally, the plurality of magnetic tunnel junctions 140 can be formed over the plurality of magnetoelectric multiferroic portions ($248\_i$, $1 \leq i \leq N$). Each magnetic tunnel junction ($140\_i$, $1 \leq i \leq N$) including a respective grain ($136\_i$, $1 \leq i \leq N$) of the free layer 136L can be formed on a respective one of the magnetoelectric multiferroic portions ($248\_i$, $1 \leq i \leq N$). Each of the magnetic tunnel junctions ($140\_i$, 1≤i≤N) comprises a respective grain (136_i, 1≤i≤N) of the free layer 136L, an overlying portion of the tunnel barrier layer 134L, and a respective overlying portion of the reference layer 132L.

In aspect of the second embodiment, the reference layer 132L may be provided as a component within a synthetic antiferromagnetic (SAF) structure 120. In this case, an antiferromagnetic coupling layer 114 and a fixed (or "hard") ferromagnetic layer 112 can be formed over the reference layer 132L. In another aspect of the second embodiment, the SAF structure 120 including the antiferromagnetic coupling layer 114 and the fixed ferromagnetic layer 112 is omitted.

A top electrode 110 can be formed on the top surface of the fixed ferromagnetic layer 112 (if present) or over the reference layer 132L. Generally, the top electrode 110 can be electrically connected to (e.g., electrically shorted to) each portion of the reference layer 132L of the plurality of magnetic tunnel junctions 140. The top electrode 110 may be formed as a portion of a second electrically conductive line 90, or may be formed as a discrete structure over which a second electrically conductive line 90 is subsequently formed. The top electrode 110 can include at least one conductive metallic material such as a conductive metallic nitride material, an elemental metal, or an intermetallic alloy. In one embodiment, the at least one conductive metallic material can include a non-magnetic and non-ferroelectric metallic material such as TiN, TaN, WN, Ti, Ta, W, Cu, or a combination thereof. The thickness of the top electrode 110 can be in a range from 5 nm to 100 nm, although lesser and greater thicknesses may also be employed. The graded-defect-density magnetoelectric multiferroic layer 248 remains as a single continuous material layer at, and after, the processing step of formation of the top electrode 110.

Generally, a plurality of magnetic tunnel junctions 140 can be formed over the plurality of magnetoelectric multiferroic portions (248_i, 1≤i≤N). Each of the magnetic tunnel junctions (140_i, 1≤i≤N) comprises a respective reference layer (which is a portion of the reference layer 132L having an areal overlap within a respective magnetoelectric multiferroic portions (248_i, 1≤i≤N)), a respective tunnel barrier layer (which is a portion of the tunnel barrier layer 134L having an areal overlap within the respective magnetoelectric multiferroic portions (248_i, 1≤i≤N)), and a respective free layer (which is a grain of the free layer 136L having an overlap with the respective magnetoelectric multiferroic portions (248_i, 1≤i≤N)) contacting the respective one of the magnetoelectric multiferroic portions (248_i, 1≤i≤N).

While an embodiment is described for forming a magnetic tunnel junction device 180 in which magnetic tunnel junctions (140_i, 1≤i≤N) overlie magnetoelectric multiferroic portions (248_i, 1≤i≤N), embodiments are expressly contemplated herein in which the magnetoelectric multiferroic portions (248_i, 1≤i≤N) overlie the magnetic tunnel junctions (140_i, 1≤i≤N). In this case, the layer stack from the at least one optional capping layer 150 to the fixed ferromagnetic layer 112 (if present) or the reference layer 132L can be formed in reverse order to provide a magnetic tunnel junction device 180 in which the magnetoelectric multiferroic portions overlie the magnetic tunnel junctions.

Figure 4A:
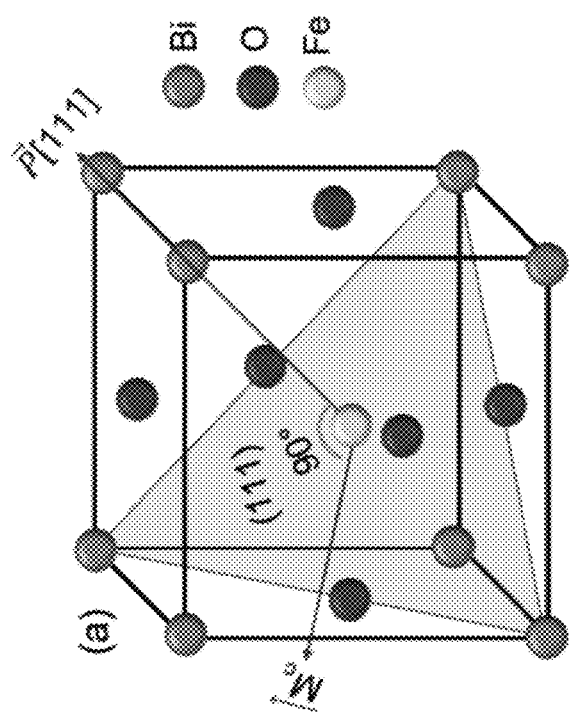
FIG. 4A is a perspective view of a unit cell of $BifeO_3$ with ferroelectric polarization and magnetic moment
Figure 4B:
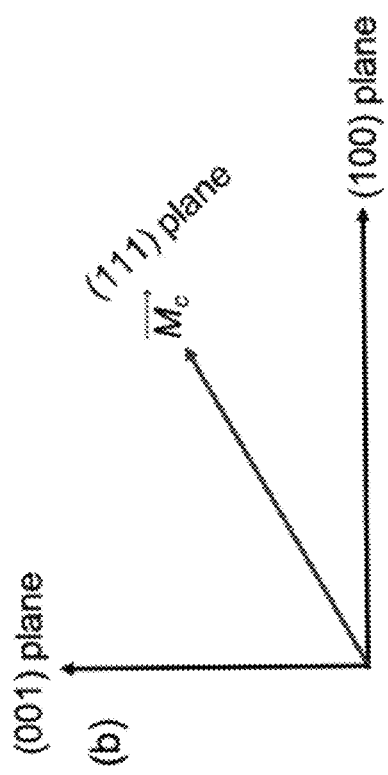
FIG. 4B illustrates the relative spatial orientation between the ferroelectric polarization and the magnetic moment directions of the unit cell of $BiFeO_3$ of FIG. 4A.

FIG. 4A illustrates a cubic unit cell of $BiFeO_3$ with a direction of ferroelectric polarization P along a [111] direction and a canted magnetic moment direction Mc within the (111) plane. FIG. 4B illustrates the in plane (100) and out of plane (001) components of the magnetic moment direction Mc in the (111) plane. The relative spatial orientation (e.g., 90 degree angle) between the magnetic moment direction Mc and the polarization direction P is the same for each magnetoelectric multiferroic portion. The out of plane (001) component of the canted magnetic moment direction Mc of each multiferroic portion is magnetically coupled to the magnetization direction of corresponding free layer via exchange bias or coupling at their interface.

Because of the relative spatial orientation between the canted magnetic moment and the ferroelectric polarization of each magnetoelectric multiferroic portion is fixed, changing the ferroelectric polarization direction in any magnetoelectric multiferroic portion also changes the canted magnetic moment direction Mc. Since the out of plane (001) component of the canted magnetic moment direction Mc of each multiferroic portion is magnetically coupled to the magnetization direction of the corresponding free layer, a change in the canted magnetic moment direction Mc of each multiferroic portion also changes the magnetization direction of the corresponding free layer (which may be a standalone free layer such as a first free layer 136A, a second free layer 136B, or a third free layer 136C, or a portion 136_i of a continuous free layer 136L) which contacts the respective multiferroic portion (148A, 148B, 148C or 248_i). The change in the magnetization direction of the free layer puts the free layer in either the parallel or antiparallel configuration with the magnetization direction of the correspond reference layer in the same magnetic tunnel junction. The parallel or antiparallel configuration of the free and reference layer magnetization directions places the magnetic tunnel junction either in the low or high resistance state, respectively.

The free layers may comprise a set of discrete free layers (such as a set of a first free layer 136A, a second free layer 136B, and a third free layer 136C) or as a set of multiple grains (136_i, 1≤i≤N) of a free layer 136L of which the magnetization direction can flip independently. The magnetization within each magnetoelectric multiferroic portion {(148A, 148B, 148C) or (248_i, 1≤i≤N)} can flip independently at different electric coercivities due to the different structural defect densities therein. Generally, a magnetoelectric multiferroic portion {(148A, 148B, 148C) or (248_i, 1≤i≤N)} having a higher structural defect density has a higher ferroelectric coercivity than a magnetoelectric multiferroic portion {(148A, 148B, 148C) or (248_i, 1≤i≤N)} having a lower structural defect density. As a consequence, the ferroelectric polarization and the corresponding canted magnetic moment direction of a magnetoelectric multiferroic portion {(148A, 148B, 148C) or (248_i, 1≤i≤N)} having a higher structural defect density flip (i.e., switch) at a higher applied electrical field (which is generated by a higher programming voltage between the top electrode 110 and the bottom electrode 170) than a magnetoelectric multiferroic portion {(148A, 148B, 148C) or (248_i, 1≤i≤N)} having a lower structural defect density.

Such multiple free layers with different magnetization directions result in multiple spin alignment states between the reference layer(s) {(132A, 132B, 132C) or 132L} and the respective free layers {(136A, 136B, 136C) or 136_i} in the respective magnetic tunnel junctions (140A, 140B, 140C or 140_i).

As a consequence, the magnetoresistance of a magnetic tunnel junction device 180 of the various embodiments of the present disclosure can have three or more values for the magnetoresistance between the top electrode 110 and the bottom electrode 170. Specifically, the total number of magnetoresistive states in a magnetic tunnel junction device 180 of the various embodiments of the present disclosure can be the same as the total number of magnetoelectric multiferroic portions {(148A, 148B, 148C) or (248_*i*, 1≤*i*≤N)} having different ferroelectric coercivities plus one.

Figure 5:
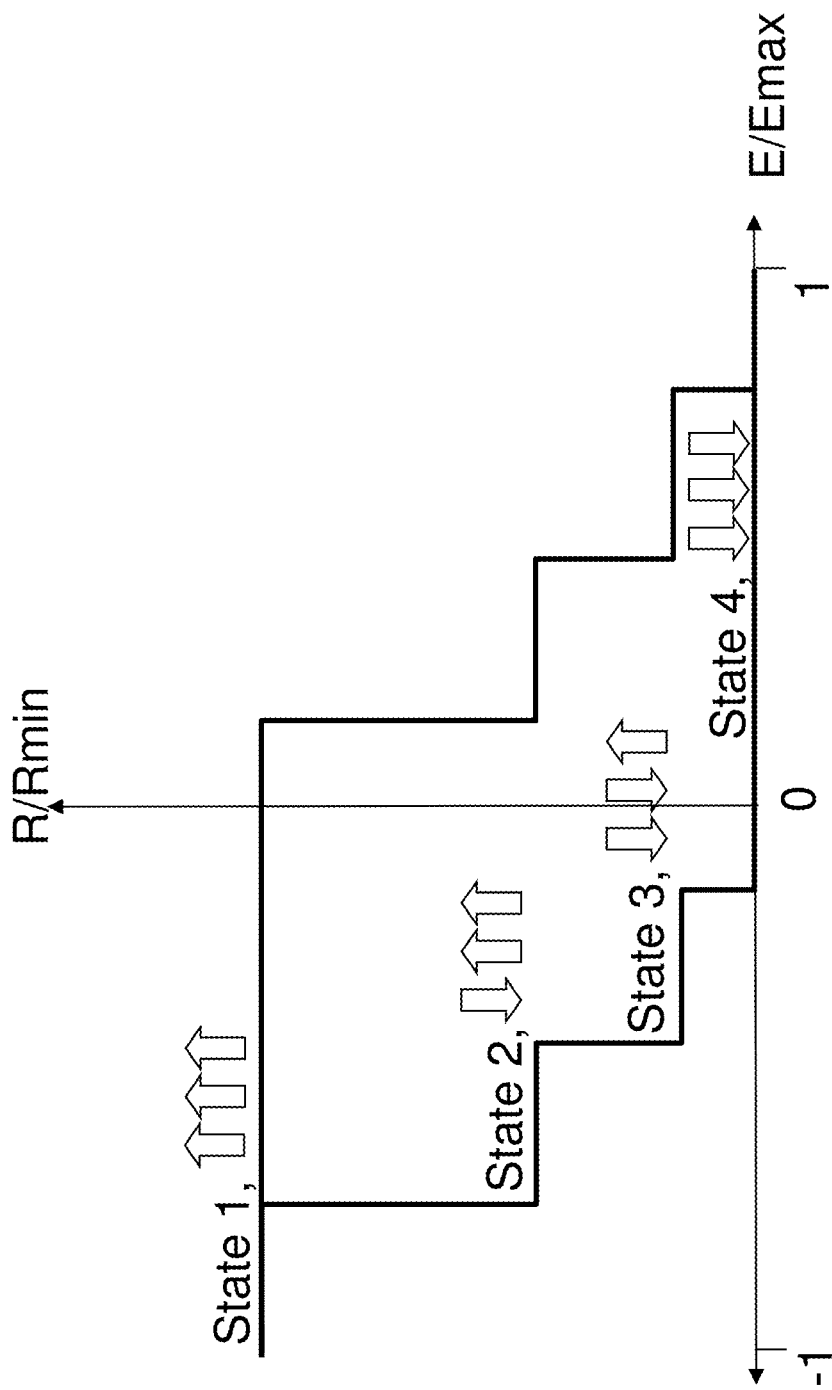
FIG. 5 is an illustration of the magnetoresistance of the magnetic tunnel junction device of FIG. 2D as a function of applied electrical field according to an embodiment of the present disclosure.

FIG. 5 illustrates the tunnel magnetoresistance as a function of the applied electrical field (i.e., programming voltage) across the magnetoelectric multiferroic portions (148A, 148B, 148C) in the exemplary magnetic tunnel junction device of FIG. 2D. The graph in FIG. 5 is normalized along the horizontal axis by the magnitude of the maximum electrical field $E_{max}$ that can be applied between the top electrode 110 and the bottom electrode 170. Further, the graph in FIG. 5 is normalized along the vertical axis by the minimum magnetoresistance of the exemplary magnetic tunnel junction device of FIG. 2D. If three magnetoelectric multiferroic portions (148A, 148B, 148C) are present in the exemplary magnetic tunnel junction device of FIG. 2D, then four magnetoresistive states can be formed as a function of the applied programming voltage between the top electrode 110 and the bottom electrode 170. In the illustrated example, the direction of magnetization of the reference layers (132A, 132B, 132C) is presumed to be downward, parallel alignment of spins between each reference layer (132A, 132B, 132C) and an underlying free layer (136A, 136B, 136C) is presumed to provide a lower magnetoresistance than antiparallel alignment, and the directions of the arrows represent the directions of the magnetizations of the three free layers (136A, 136B, 136C).

The application of positive and negative programming voltages may deterministically switch the magnetization direction of the free layers back and forth without application of an external magnetic field. Different absolute values (i.e., magnitudes) of the critical positive and negative programming voltages are able to switch the magnetization direction of one, two or all three free layers in the device 180.

For example, a lowest absolute value of the critical positive programming voltage is able to switch the magnetization direction of only one free layer 136C which is magnetically coupled to the respective multiferroic region 148C with the lowest density of structural defects. Thus, the device is switched from magnetoresistive state 1 to state 2 in FIG. 5. A middle absolute value of the critical positive programming voltage is able to switch the magnetization of two free layers (136B, 136C) which are magnetically coupled to the respective multiferroic regions (148B, 148C) with the middle and lowest density of structural defects. Thus, the device is switched from magnetoresistive state 2 to state 3 in FIG. 5. However, the magnetization direction of the free layer 136A which is magnetically coupled to the respective multiferroic region 148A with the highest density of structural defects is not switched. A highest absolute value of the critical positive programming voltage is able to switch the magnetization direction of all three free layers (136A, 136B, 136C) which are magnetically coupled to the respective multiferroic regions (148A, 148B, 148C). Thus, the device is switched from magnetoresistive state 3 to state 4 in FIG. 5. Thus, four magnetoresistive states may be obtained in a device 180 containing three free layers and three multiferroic regions. The same four states may be achieved in reverse (i.e., from state 4 to state 1) using different absolute values (i.e., magnitudes) of the critical negative programming voltages.

Generally, at least two magnetoelectric multiferroic portions {(148A, 148B, 148C) or (248_*i*, 1≤*i*≤N)} can be provided within each magnetic tunnel junction device 180. The magnetoresistance between the bottom electrode 170 and the top electrode 110 can have at least three different values that depend on magnetization directions of the plurality of magnetoelectric multiferroic portions in each magnetic tunnel junction device 180 of the present disclosure.

Figure 6:
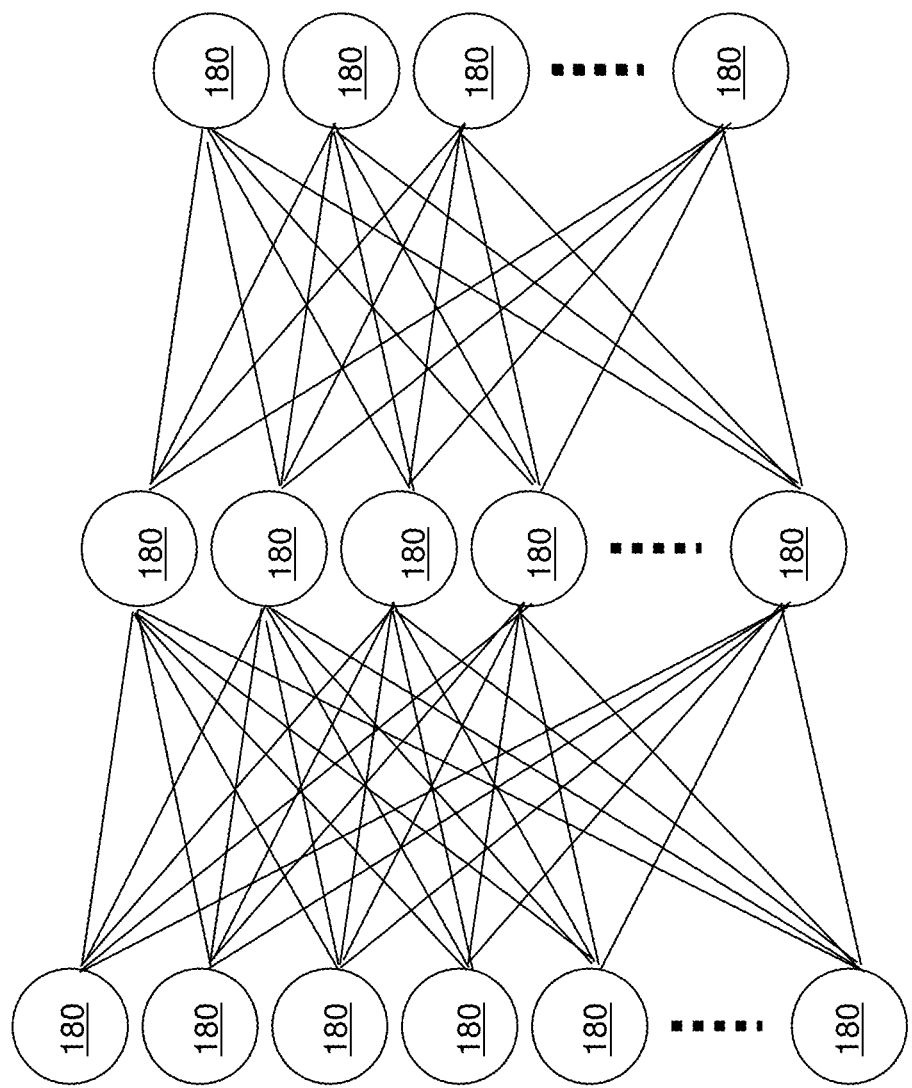
FIG. 6 is an interconnected network of magnetic tunnel junction devices of the present disclosure that are connected in a synaptic connection configuration according to an embodiment of the present disclosure.

Referring to FIG. 6, an interconnected network of magnetic tunnel junction devices 180 of the embodiments of the present disclosure is illustrated. The magnetic tunnel junction devices 180 of the embodiments of the present disclosure can be connected in a synaptic connection configuration. The magnetic tunnel junction devices 180 can be connected in a synaptic connection configuration in which output nodes of one group of magnetic tunnel junction devices 180 are connected to a respective set of multiple input nodes of another group of magnetic tunnel junction devices 180. The average number of connections per output node of each magnetic tunnel junction device 180 may be at least three, and may be four or more. The connections within the synaptic connection configurations may be confined within physical proximity of each magnetic tunnel junction device. For example, the electrical connection may be limited up to second nearest neighbor magnetic tunnel junction devices, third nearest neighbor magnetic tunnel junction devices, fourth nearest neighbor ferroelectric devices, or any other predetermined level of physical proximity. Such synaptic connection configuration can be advantageously employed to provide a computing device in which multiple possibilities are simultaneously calculated, and probabilistic answers to a given question are provided. The conductance of each path can increase within an increase of respective control voltage in such a synaptic connection configuration. Thus, the path that provides the most electrical current under a set of predetermined control voltages (such as a set of bias voltages to a selected subset of the magnetic tunnel junction devices 180) can be determined within a timeframe of nanoseconds.

While a magnetic tunnel junction device 180 containing a tunnel barrier layer 134 (e.g., MgO layer) is described above, other types of spintronic (e.g., MRAM) devices with different magnetic junctions may be formed instead. For example, a spin valve or pseudo spin valve giant magnetoresistive (GMR) device may be formed instead. In the spin valve device, the tunneling barrier layer is replaced with an electrically conductive, non-magnetic spacer layer. A spin valve device typically includes the SAF structure which pins the reference layer. The SAF structure may be omitted in the pseudo spin valve device, and different ferromagnetic materials having different coercivities may be used for the free layer and the reference layer. The spin valve and pseudo spin valve devices may be formed over or under the multiferroic portions which are coupled to the respective free layers.

Referring to all drawings and according to various embodiments of the present disclosure, a magnetic device 180 includes a first electrode 170, a second electrode, 110 a plurality of magnetic junctions 140 each containing a ferromagnetic reference layer 132 and a ferromagnetic free layer 136 located between the first electrode and the second electrode, and a plurality of magnetoelectric multiferroic portions {(148A, 148B, 148C) or (248_*i*)} having different structural defect densities located between the first electrode and the second electrode. Each of the plurality of magnetoelectric multiferroic portions is magnetically coupled to the ferromagnetic free layer 136 of a respective one of the plurality of magnetic junctions 140.

In one embodiment, the plurality of magnetic junctions 140 comprise a plurality of magnetic tunnel junctions {(140A, 140B, 140C), or (140_*i*, 1≤*i*≤N)}, each comprising a respective reference layer (132A, 132B, 132C, or a portion of 132L), a respective tunnel barrier layer (134A, 134B, 134C, or a portion of 134L), and a respective ferromagnetic free layer (136A, 136B, 136C, or a portion of 136L).

In one embodiment, the plurality of magnetoelectric multiferroic portions {(148A, 148B, 148C) or (248_i)} comprise, and/or consist essentially of, a material selected from $BiFeO_3$, $h\text{-}YMnO_3$, $BaNiF_4$, $PbVO_3$, $BiMnO_3$, $LuFe_2O_4$, $HoMn_2O_5$, $h\text{-}HoMnO_3$, $h\text{-}ScMnO_3$, $h\text{-}ErMnO_3$, $h\text{-}TmMnO_3$, $h\text{-}YbMnO_3$, $h\text{-}LuMnO_3$, $K_2SeO_4$, $Cs_2CdI_4$, $TbMnO_3$, $Ni_3V_2O_8$, $MnWO_4$, $CuO$, $ZnCr_2Se_4$, $LiCu_2O_2$, or $Ni_3B_7O_{13}I$.

In one embodiment, each of the plurality of magnetoelectric multiferroic portion {(148A, 148B, 148C) or (248_i)} has a respective canted magnetic moment direction Mc and a respective ferroelectric polarization direction P. A relative spatial orientation between the respective canted magnetic moment direction and a respective ferroelectric polarization direction within each magnetoelectric multiferroic portion is the same. Each magnetoelectric multiferroic portion {(148A, 148B, 148C) or (248_i)} contacts a respective ferromagnetic free layer (136A, 136B, 136C, or a portion of 136L), and has a respective out of plane (e.g., (001)) component of the canted magnetic moment that is magnetically coupled to the respective free layer via exchange coupling or bias.

In one embodiment, wherein magnetoresistance between the first electrode 170 and the second electrode 110 has at least three different values that depend on the respective canted magnetic moment direction Mc of the plurality of magnetoelectric multiferroic portions and the magnetization direction of the respective magnetically coupled free layer relative to the magnetization direction of the reference layer in the same magnetic junction.

In one embodiment, the first electrode 170 comprises a bottom electrode, the second electrode 110 comprises a top electrode located over the bottom electrode, and the plurality of magnetic junctions 140 are located above or below the plurality of magnetoelectric multiferroic portions.

In one embodiment, the different structural defect densities may comprise a different density of broken bonds in the different magnetoelectric multiferroic portions, a different density of displaced atoms in a crystal lattice in the different magnetoelectric multiferroic portions, and/or a different density of gallium or helium atoms in the different magnetoelectric multiferroic portions.

In one embodiment, the plurality of magnetoelectric multiferroic portions comprise a first magnetoelectric multiferroic portion 148A having a first structural defect density and a first ferroelectric coercivity, and a second magnetoelectric multiferroic portion 148B having a second structural defect density higher than the first structural defect density, and a second ferroelectric coercivity higher than the first ferroelectric coercivity.

In the first embodiment illustrated in FIGS. 2D, 2E and 2F, the plurality of magnetic junctions 140 comprise discrete magnetic tunnel junctions (140A, 140B, 140C) that do not directly contact one another and the plurality of magnetoelectric multiferroic portions (148A, 148B, 148C) are separated by distinct boundaries 146.

In the second embodiment illustrated in FIG. 3C, the plurality of magnetoelectric multiferroic portions 248_i lack distinct boundaries within a single continuous magnetoelectric multiferroic layer 248 and have a graded structural defect density that monotonically laterally changes from one side to another, and the plurality of magnetic junctions 140_i comprise a continuous polycrystalline ferromagnetic free layer 136L having a plurality of grains separated by domain wall grain boundaries.

The various embodiments of the present disclosure provide a magnetic junction device 180 including three or more magnetoresistive states. The magnetic junction device 180 can be provided as a single standalone device. Alternatively, plural magnetic junction devices 180 may be arranged in an array configuration or a synaptic connection configuration to provide a random access memory (e.g., a magnetoresistive memory) device or a synaptic configuration computing device.

According to an embodiment, a method of forming a plurality of magnetoelectric multiferroic portions in a continuous magnetoelectric multiferroic layer comprises structurally damaging different portions of the continuous magnetoelectric multiferroic layer with different structural defect densities. In one embodiment, structurally damaging different portions of the continuous magnetoelectric multiferroic layer comprises performing a different focused ion beam irradiation process in each of the plurality of magnetoelectric multiferroic portions to provide the different structural defect densities in each of the plurality of the magnetoelectric multiferroic portions. The different focused ion beam irradiation processes may result in at least one of a different density of broken bonds in different magnetoelectric multiferroic portions, a different density of displaced atoms in a crystal lattice in the different magnetoelectric multiferroic portions, or different density of gallium or helium atoms in the different magnetoelectric multiferroic portions. In the first embodiment, the method includes forming discrete magnetic tunnel junctions that do not direct contact one formed above or below magnetoelectric multiferroic portions separated by distinct boundaries. In the second embodiment, the focused ion beam irradiation generates a graded structural defect density that monotonically laterally changes from one side to another within the continuous magnetoelectric multiferroic layer. A continuous magnetic tunnel junction stack is formed over the continuous magnetoelectric multiferroic layer, where different regions of the continuous magnetic tunnel junction stack comprise plurality of magnetic junctions.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A magnetic device, comprising:
a first electrode;
a second electrode;
a plurality of magnetic junctions each comprising a ferromagnetic reference layer and a ferromagnetic free layer located between the first electrode and the second electrode;
a plurality of magnetoelectric multiferroic portions having different structural defect densities located between the first electrode and the second electrode, wherein each of the plurality of magnetoelectric multiferroic portions is magnetically coupled to the ferromagnetic free layer of a respective one of the plurality of magnetic junctions; and further comprising at least one feature selected from:
(a) a first feature in which:
  the different structural defect densities comprise a different density of broken bonds in the different magnetoelectric multiferroic portions; or
(b) a second feature in which:
  the different structural defect densities comprise a different density of displaced atoms in a crystal lattice in the different magnetoelectric multiferroic portions; or
(c) a third feature in which:
  the different structural defect densities comprise a different density of gallium or helium atoms in the different magnetoelectric multiferroic portions; or
(d) a fourth feature in which:
  the plurality of magnetoelectric multiferroic portions comprise a first magnetoelectric multiferroic portion having a first structural defect density and a first ferroelectric coercivity; and a second magnetoelectric multiferroic portion having a second structural defect density higher than the first structural defect density, and a second ferroelectric coercivity higher than the first ferroelectric coercivity; or
(e) a fifth feature in which:
  the plurality of magnetoelectric multiferroic portions comprise portions without distinct boundaries within a single continuous magnetoelectric multiferroic layer having a graded structural defect density that monotonically laterally changes from one side to another; and the plurality of magnetic junctions comprise a continuous polycrystalline ferromagnetic free layer having a plurality of grains separated by domain wall grain boundaries.

2. The magnetic device of claim 1, wherein the magnetic device comprises a magnetoresistive memory device, and the plurality of magnetic junctions comprise a plurality of magnetic tunnel junctions each comprising a tunnel barrier layer.

3. The magnetic device of claim 2, wherein the plurality of magnetoelectric multiferroic portions comprise a material selected from $BiFeO_3$, $h-YMnO_3$, $BaNiF_4$, $PbVO_3$, $BiMnO_3$, $LuFe_2O_4$, $HoMn_2O_5$, $h-HoMnO_3$, $h-ScMnO_3$, $h-ErMnO_3$, $h-TmMnO_3$, $h-YbMnO_3$, $h-LuMnO_3$, $K_2SeO_4$, $Cs_2CdI_4$, $TbMnO_3$, $Ni_3V_2O_8$, $MnWO_4$, $CuO$, $ZnCr_2Se_4$, $LiCu_2O_2$, or $Ni_3B_7O_{13}I$.

4. The magnetic device of claim 3, wherein the plurality of magnetoelectric multiferroic portions comprise $BiFeO_3$.

5. A magnetic device, comprising:
a first electrode;
a second electrode;
a plurality of magnetic junctions each comprising a ferromagnetic reference layer and a ferromagnetic free layer located between the first electrode and the second electrode; and
a plurality of magnetoelectric multiferroic portions having different structural defect densities located between the first electrode and the second electrode, wherein each of the plurality of magnetoelectric multiferroic portions is magnetically coupled to the ferromagnetic free layer of a respective one of the plurality of magnetic junctions;

wherein:
each of the plurality of magnetoelectric multiferroic portions has a respective canted magnetic moment direction and a respective ferroelectric polarization direction; and
a relative spatial orientation between the respective canted magnetic moment direction and a respective ferroelectric polarization direction within each magnetoelectric multiferroic portion is the same.

6. The magnetic device of claim 5, wherein each magnetoelectric multiferroic portion contacts a respective ferromagnetic free layer, and has a respective out of plane component of the canted magnetic moment direction that is magnetically coupled to the respective free layer via exchange coupling or bias.

7. The magnetic device of claim 6, wherein magnetoresistance between the first electrode and the second electrode has at least three different values that depend on the respective canted magnetic moment direction of the plurality of magnetoelectric multiferroic portions and the magnetization direction of the respective magnetically coupled free layer relative to the magnetization direction of the reference layer in the same magnetic junction.

8. The magnetic device of claim 1, wherein:
the first electrode comprises a bottom electrode;
the second electrode comprises a top electrode located over the bottom electrode; and
the plurality of magnetic junctions are located above or below the plurality of magnetoelectric multiferroic portions.

9. The magnetic device of claim 1, wherein the at least one feature comprises the first feature.

10. The magnetic device of claim 1, wherein the at least one feature comprises the second feature.

11. The magnetic device of claim 1, wherein the at least one feature comprises the third feature.

12. The magnetic device of claim 1, wherein the at least one feature comprises the fourth feature.

13. The magnetic device of claim 1, wherein the plurality of magnetic junctions comprise discrete magnetic tunnel junctions that do not directly contact one another, and wherein the plurality of magnetoelectric multiferroic portions are separated by distinct boundaries.

14. The magnetic device of claim 1, wherein the at least one feature comprises the fifth feature.

15. An interconnected network of magnetic devices that are connected in a synaptic connection configuration, wherein the magnetic devices comprise:
a first electrode;
a second electrode;
a plurality of magnetic junctions each comprising a ferromagnetic reference layer and a ferromagnetic free layer located between the first electrode and the second electrode; and
a plurality of magnetoelectric multiferroic portions having different structural defect densities located between the first electrode and the second electrode, wherein each of the plurality of magnetoelectric multiferroic portions is magnetically coupled to the ferromagnetic free layer of a respective one of the plurality of magnetic junctions.

16. A method of forming a magnetic device, comprising:
forming a bottom electrode;
forming a continuous magnetoelectric multiferroic layer over the bottom electrode;
forming a plurality of magnetoelectric multiferroic portions in the continuous magnetoelectric multiferroic layer by structurally damaging different portions of the continuous magnetoelectric multiferroic layer with different structural defect densities;

forming a plurality of magnetic junctions located over or under the plurality of magnetoelectric multiferroic portions, wherein each of the magnetic junctions comprises a respective reference layer and a respective free layer contacting a respective one of the magnetoelectric multiferroic portions; and forming a top electrode over the bottom electrode, the plurality of magnetoelectric multiferroic portions and the plurality of magnetic junctions.

17. The method of claim 16, wherein structurally damaging different portions of the continuous magnetoelectric multiferroic layer comprises performing a different focused ion beam irradiation process in each of the plurality of magnetoelectric multiferroic portions to provide the different structural defect densities in each of the plurality of the magnetoelectric multiferroic portions.

18. The method of claim 17, wherein:

the different focused ion beam irradiation processes result in at least one of a different density of broken bonds in different magnetoelectric multiferroic portions, a different density of displaced atoms in a crystal lattice in the different magnetoelectric multiferroic portions, or a different density of gallium or helium atoms in the different magnetoelectric multiferroic portions; and the different focused ion beam irradiation processes are performed on exposed different magnetoelectric multiferroic portions or through the plurality of magnetic junctions overlying the different magnetoelectric multiferroic portions.

19. The method of claim 18, wherein forming the plurality of magnetic junctions comprises forming discrete magnetic tunnel junctions that do not direct contact one another, and wherein the plurality of magnetoelectric multiferroic portions are separated by distinct boundaries.

20. The method of claim 18, wherein:

the focused ion beam irradiation generates a graded structural defect density that monotonically laterally changes from one side to another within the continuous magnetoelectric multiferroic layer without distinct boundaries; and forming the plurality of magnetic junctions comprises forming a continuous magnetic tunnel junction stack over the continuous magnetoelectric multiferroic layer, wherein different regions of the continuous magnetic tunnel junction stack comprise plurality of magnetic junctions.

* * * * *